(12) United States Patent
Kawakubo et al.

(10) Patent No.: US 6,809,604 B2
(45) Date of Patent: Oct. 26, 2004

(54) VOLTAGE CONTROL OSCILLATOR HAVING A FERROELECTRIC THIN FILM PEROVSKITE SINGLE CRYSTAL RESONATOR

(75) Inventors: Takashi Kawakubo, Kanagawa-ken (JP); Ryoichi Ohara, Kanagawa-ken (JP); Kazuhide Abe, Kanagawa-ken (JP); Hiroshi Tsurumi, Kanagawa-ken (JP); Hiroshi Yoshida, Kanagawa-ken (JP); Ryuichi Fujimoto, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/397,876

(22) Filed: Mar. 27, 2003

(65) Prior Publication Data

US 2003/0227338 A1 Dec. 11, 2003

(30) Foreign Application Priority Data

Mar. 29, 2002 (JP) ........................................ 2002-097050

(51) Int. Cl.[7] ................................................ H03B 5/32
(52) U.S. Cl. .................................... 331/107 A; 331/158
(58) Field of Search ............................ 331/107 A, 158, 331/176; 333/193; 428/688, 701

(56) References Cited

U.S. PATENT DOCUMENTS

| | | | |
|---|---|---|---|
| 5,248,564 A | * | 9/1993 | Ramesh ...................... 428/688 |
| 5,802,854 A | | 9/1998 | Maeda et al. |
| 5,821,005 A | * | 10/1998 | Kijima et al. ................ 428/701 |
| 6,690,246 B2 | * | 2/2004 | Kimura et al. .............. 331/176 |
| 6,720,846 B2 | * | 4/2004 | Iwashita et al. ............ 333/193 |

OTHER PUBLICATIONS

U.S. patent application Ser. No. 10/397,876, Kawakubo et al., filed Mar. 27, 2003.
U.S. patent application Ser. No. 10/397,176, Kawakubo et al., filed Mar. 27, 2003.

* cited by examiner

Primary Examiner—Robert Pascal
Assistant Examiner—Joseph Chang
(74) Attorney, Agent, or Firm—Oblon, Spivak, McClelland, Maier & Neustadt, P.C.

(57) ABSTRACT

To provide a miniaturized voltage controlled oscillator which can oscillate simultaneously a plurality of frequencies and has high stability of frequency, an excellent low phase noise, small variation per hour, and a wide frequency variable range.

A thin film bulk acoustic wave resonator using single crystal ferroelectric material equal to or smaller than 10 μm in thickness whose direction of polarization is aligned to the direction of thickness is utilized as the piezoelectric member. The voltage controlled oscillator having large changing rate of the oscillation frequency of 0.01%/V or more and an extremely small phase noise is provided by changing the voltage applied to the electrodes.

19 Claims, 13 Drawing Sheets

N-COUPLING

VOLTAGE CONTROL OSCILLATOR HAVING A FERROELECTRIC THIN FILM PEROVSKITE SINGLE CRYSTAL RESONATOR

CROSS-REFERENCE TO RELATED APPLICATIONS

This application is based upon and claims the benefit of priority from the prior Japanese Patent Application No. 2002-97050, filed on Mar. 29, 2002; the entire contents of which are incorporated herein by reference.

BACKGROUND OF THE INVENTION

1. Field of the Invention

The present invention relates to a voltage controlled oscillator.

2. Related Art

The voltage controlled oscillator employing a thin film bulk acoustic wave resonator has been noticed in late years. The thin film bulk acoustic wave resonator is an element that comprises a lower electrode, a piezoelectric film and an upper electrode formed over a cavity formed on a substrate in order.

Such thin film bulk acoustic wave resonator generates resonance at a frequency whose half-wavelength is equal to the sum of the thickness of the lower electrode, the upper electrode, both of the above being contacting with an air layer, and the piezoelectric film. The thickness corresponds to approximately 0.5 $\mu$m to 3 $\mu$m for the frequency of 1 GHz to 5 GHz. In this manner, it is advantageous especially for the resonance of high frequency region higher than GHz level.

FIG. 27 shows change of impedance in the vicinity of the resonant frequency for such thin film bulk acoustic wave resonator.

As shown in FIG. 27, the impedance presents the maximum value at the anti-resonant frequency $f_A$, and the minimum value at the resonant frequency $f_R$.

FIG. 28 further shows change of the phase in the vicinity of the resonant frequency for the thin film bulk acoustic wave resonator.

As shown in FIG. 28, the phase delays by 90 degrees at a frequency equal to or higher than the anti-resonant frequency $f_A$ or equal to or lower than the resonant frequency $f_R$, and leads by 90 degrees at a frequency between the anti-resonant frequency and the resonant frequency.

A resonance circuit can be formed with the aid of such impedance characteristics and phase characteristics.

The anti-resonant frequency $f_A$ and the resonant frequency $f_R$ have a relation to the effective electromechanical coupling coefficient $k^2eff$ as follows.

$$k^2eff=(f_A^2-f_R^2)/f_A^2-2(f_A-f_R)/f_A \qquad \text{equation (1)}$$

Therefore, the difference between the resonant frequency $f_R$ and the anti-resonant frequency $f_A$ is determined by the electromechanical coupling coefficient of the ferroelectric film $k^2eff$.

When the voltage controlled oscillator is formed by using such thin film bulk acoustic wave resonator, the thin film bulk acoustic wave resonator is generally used by combining in series or in parallel with a varicap element such as a varactor whose capacitance varies in accordance with voltage.

In the case where the capacitance component and the thin film bulk acoustic wave resonator are combined like the above, the oscillation frequency lies between the resonant frequency and the anti-resonant frequency of the thin film bulk acoustic wave resonator. As evidenced by the equation (1), the range of the oscillation frequency is limited effectively by the electromechanical coupling coefficient $k^2eff$.

Besides, because Q value of the varactor is far smaller than Q value of the thin film bulk acoustic wave resonator, Q value of the voltage controlled oscillator decreases, so that there is a problem that phase noise becomes large.

Furthermore, combining in series or in parallel with a reactor element such as a coil is often put to practical use to widen the variable range of the frequency. However, Q value of the voltage controlled oscillator further decreases because Q value of the reactor element is extremely low, and consequently there is a problem that the phase noise gets increased furthermore. Moreover there is a problem that the reactor element has a large variation per hour and lacks stability.

The present invention is intended to provide a novel miniaturized voltage controlled oscillator which has high stability of frequency, excellent property to the phase noise, small variation per hour, and a wide frequency variable range in view of the problems mentioned above.

BRIEF SUMMARY OF THE INVENTION

To achieve the object mentioned above, the present invention provides a voltage controlled oscillator comprising:

at least one thin film bulk acoustic wave resonator comprising;
  a ferroelectric thin film equal to or smaller than 10 $\mu$m in thickness of perovskite type single crystal whose direction of polarization is aligned to the direction of thickness thereof; and
  a pair of thin film electrodes provided so as to interpose the ferroelectric thin film between them, and changing a resonant frequency by a voltage applied between the pair of thin film electrodes:
a control voltage circuit applying the voltage between the pair of thin film electrodes: and
an amplifier coupled with the thin film bulk acoustic wave resonator constituting an oscillation circuit in cooperation with the resonator.

Moreover, the invention provides a voltage controlled oscillator comprising a plurality of the thin film bulk acoustic wave resonators elastically coupled to each other.

Furthermore, the invention provides the voltage controlled oscillator which is a balanced circuit combining the plurality of thin film bulk acoustic wave resonator.

In addition, the present invention provides a voltage controlled oscillator comprising; a first oscillation loop comprising a first thin film bulk acoustic wave resonator and a first amplifier, a second oscillation loop comprising a second thin film bulk acoustic wave resonator and a second amplifier and being insulated electrically from the first oscillation loop, and means for coupling elastically the first thin film bulk acoustic wave resonator to the second thin film bulk acoustic wave resonator.

The elastic coupling is preferably a reverse (negative) phase coupling.

It is preferable that the plurality of the thin film bulk acoustic wave resonators are connected in series to construct a series circuit, and the amplifier is connected in parallel to the series circuit, for oscillating at a frequency in the vicinity of an anti resonant point of the plurality of thin film bulk acoustic wave resonator.

It is preferable that the voltage controlled oscillator oscillates at a frequency in the vicinity of a resonance point of the first and the second thin film bulk acoustic wave resonators.

Additionally, the present invention provides a voltage controlled oscillator comprising; a series circuit or a parallel circuit comprising the thin film bulk acoustic wave resonator and a capacitor of a predetermined capacitance connected on at least one electrode of the thin film bulk acoustic wave resonator, and the resonant frequency of the circuit being changed by a voltage applied between the pair of the electrodes of the thin film bulk acoustic wave resonator.

Furthermore, the voltage control circuit preferably generates a DC voltage.

Moreover, the ferroelectric thin film is preferably an epitaxial growth film of barium titanate or lead zirconate titanate as a principal component.

The present invention further provides a voltage controlled oscillator comprising:
a first thin film bulk acoustic wave resonator comprising;
a first ferroelectric thin film equal to or smaller than 10 $\mu$m in thickness of perovskite type single crystal whose direction of polarization is aligned to the direction of thickness thereof; and
first and second thin film electrodes provided so as to interpose the first ferroelectric thin film between them:
a second thin film bulk acoustic wave resonator comprising;
a second ferroelectric thin film equal to or smaller than 10 $\mu$m in thickness of perovskite type single crystal whose direction of polarization is aligned to the direction of thickness thereof; and
a third thin film electrode interposing the second ferroelectric thin film, in cooperation with the second electrode, and deposited on the first thin film bulk acoustic wave resonator in the direction of thickness thereof and sharing the second electrode as a common electrode:
a control voltage circuit applying a voltage between the electrodes: and
an amplifier coupled with the first and the second thin film bulk acoustic wave resonators to constitute an oscillation circuit.

In this case, thickness including the first and the second ferroelectric thin films and the first to the third electrodes is preferably one fourth of the wavelength of a fundamental oscillation frequency.

In addition, the present invention provides a voltage controlled oscillator comprising:
a substrate:
a first thin film bulk acoustic wave resonator provided on the substrate comprising;
a ferroelectric thin film equal to or smaller than 10 $\mu$m in thickness of perovskite type single crystal whose direction of polarization is aligned to the direction of thickness thereof; and
a first and a second thin film electrodes interposing the ferroelectric thin film between them:
a second thin film bulk acoustic wave resonator comprising a third and a fourth thin film electrodes to interpose the ferroelectric thin film between them, provided adjacent to the first thin film bulk acoustic wave resonator on the substrate, and sharing the ferroelectric film with the first thin film bulk acoustic wave resonator:
a control voltage circuit applying a voltage between the thin film electrodes: and
an amplifier coupled with the first and the second thin film bulk acoustic wave resonators, constituting an oscillation circuit.

Furthermore the invention provides a voltage controlled oscillator comprising:
a plurality of voltage controlled oscillator comprising;
at least one thin film bulk acoustic wave resonator comprising;
a ferroelectric thin film equal to or smaller than 10 $\mu$m in thickness of perovskite type single crystal whose direction of polarization is aligned to the direction of thickness thereof; and
a pair of thin film electrodes interposing the ferroelectric thin film between them, and changing a resonant frequency by a voltage applied between the pair of thin film electrodes;
a control voltage circuit applying the voltage between the pair of thin film electrodes; and
an amplifier connected to the thin film bulk acoustic wave resonator to constitute an oscillation circuit in cooperation with the resonator:
means for oscillating the plurality of the voltage controlled oscillators with different frequencies: and
a multiplier connected to the plurality of the voltage controlled oscillators to output a difference of output frequencies of the voltage controlled oscillators.

In this case, the voltage controlled oscillator preferably comprises a plurality of capacitors connected selectively to the thin film bulk acoustic wave resonator so as to construct a series or a parallel circuit therewith, wherein the resonant frequency is controlled by means of combining with at least one of the capacitors.

As a variation, the voltage controlled oscillator preferably comprises a plurality of thin film bulk acoustic wave resonators connected selectively to a predetermined capacitor to construct a series or a parallel circuit therewith, wherein the resonant frequency is controlled by means of combining with at least one of the thin film bulk acoustic wave resonators.

Besides the present invention provides a voltage controlled oscillator comprising:
a substrate:
a thin film bulk acoustic wave resonator provided on the substrate, comprising;
a ferroelectric thin film equal to or smaller than 10 $\mu$m in thickness of perovskite type single crystal whose direction of polarization is aligned to the direction of thickness thereof; and
first and second thin film electrodes provided so as to interpose the ferroelectric thin film between them:
a switching element comprising thin film electrodes provided adjacent to the thin film bulk acoustic wave resonator on the substrate, and sharing the ferroelectric film with the thin film bulk acoustic wave resonator, so as to interpose the ferroelectric thin film between them, and the ferroelectric thin film to be an actuator:
a control voltage circuit applying a voltage between the first and the second electrodes: and
an amplifier connected to the first and the thin film bulk acoustic wave resonators so as to constitute an oscillation circuit.

DETAILED DESCRIPTION OF THE INVENTION

Figure 1:
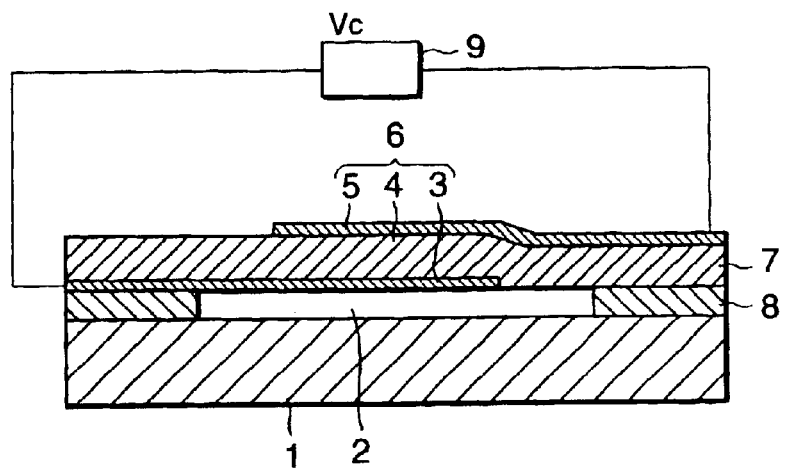
FIG. 1 is a cross section of the thin film bulk acoustic wave resonator relating to the embodiment 1 of the invention.

Hereinafter, embodiments of the present invention will be explained in detail by the aid of drawings. However the invention is not limited to the embodiments described below, but many variations can be utilized.

The inventors have repeatedly investigated utilization of ferroelectric material for a piezoelectric member of the thin film bulk acoustic wave resonator widely from the viewpoint of both theory and experiment. As a result, it was found that because the ferroelectric material possesses intrinsically the property that changes the acoustic velocity on a large scale by applying an electric field thereto, oscillation frequency thereof could be changed by applying a control voltage to the ferroelectric material if some conditions are satisfied.

Specifically, the ferroelectric material used for the piezoelectric member is required to be a single crystal film whose polarization direction is aligned to the direction of the thickness thereof. The direction of polarization of the ferroelectric film is required to be aligned to the direction of the thickness thereof in order to derive the piezoelectric property of the ferroelectric film sufficiently and to be able to change the frequency by applying the voltage thereto. To this end, the single crystal is preferably prepared by epitaxial growth.

In addition, it is necessary that the thickness of the ferroelectric film is equal to or smaller than 10 $\mu$m, preferably not more than 3 $\mu$m. Because the electric field applied to the ferroelectric member must be great to make the variable range of the frequency wide, the thickness should be equal to or smaller than 10 $\mu$m in consideration of the voltage applicable to the mobile communication apparatus being approximately 3 V.

The voltage controlled oscillator modulating the oscillation frequency can be provided by interposing the ferroelectric film between a pair of electrodes and changing the voltage applied between the electrodes.

Such voltage controlled oscillator changes the resonant frequency itself of the ferroelectric film, so that the variable range of the frequency can be determined regardless of the electromechanical coupling coefficient. Moreover, a circuit that does not require a varactor, which is difficult to be integrated and has a low Q value, can be constructed.

Furthermore, changing rate of the resonant frequency of the voltage controlled oscillator to the control voltage can be enlarged to some extent. Taking account of an operating voltage of a usual portable wireless apparatus being 3 V or less, it can be realized that the changing rate is equal to or larger than 0.01%/V, preferably 0.02%/V.

The ferroelectric material such as barium titanate and PZT prepared by epitaxial growth is desirable to realize such changing rate.

The inventors found that the change of the resonant frequency of about 0.5% could be realized by applying the bias voltage of 3 V to the ferroelectric film of 1 µm in thickness corresponding to the oscillation frequency of approximately 2 GHz for barium titanate.

In consequence, the oscillation circuit with an extremely high Q value can be constructed by using barium titanate as the ferroelectric material. In this case, the voltage controlled oscillator stable to circuit constants thereof or noises (of low noise) can be constructed because changing range of the oscillation frequency is determined by the variable range of the resonant frequency (not between resonant frequency and anti-resonant frequency).

(Embodiment 1)

FIG. 1 shows a cross section of the thin film bulk acoustic wave resonator used for the voltage controlled oscillator relating to the embodiment 1 of the invention.

This voltage controlled oscillator employs a ferroelectric film 7 of barium titanate prepared on a silicon substrate 1 by epitaxial growth as a piezoelectric thin film 4. Iridium (Ir) electrodes are utilized as a pair of electrodes 3, 5 formed so as to interpose the piezoelectric thin film 4 between them. The thin film resonator is formed with the ferroelectric film 4 and the pair of electrodes 3, 5 interposing the ferroelectric film.

To prepare the thin film bulk acoustic wave resonator, a SrRuO$_3$ sacrificial layer 8 is prepared on the silicon substrate 1 by epitaxial growth, and then the iridium lower electrode 3, the barium titanate ferroelectric film 7 and the iridium upper electrode 5 are also prepared thereon by epitaxial growth. Thereafter, a sacrificial layer 8 positioned under the part to become a resonance portion 6 is removed in order to form a cavity 2.

By applying an AC voltage between the electrodes 3 and 4 in the voltage controlled oscillator, alternate stress by piezoelectric reverse effect is generated, and then resonance of elastic vibration with thickness longitudinal mode is to be excited.

Additionally, the resonant frequency and the anti-resonant frequency can be changed because the acoustic velocity in the ferroelectric material varies by applying a DC bias voltage corresponding to the control voltage Vc between the pair of the electrodes 3 and 4 with the aid of a control voltage circuit 9.

Figure 2:
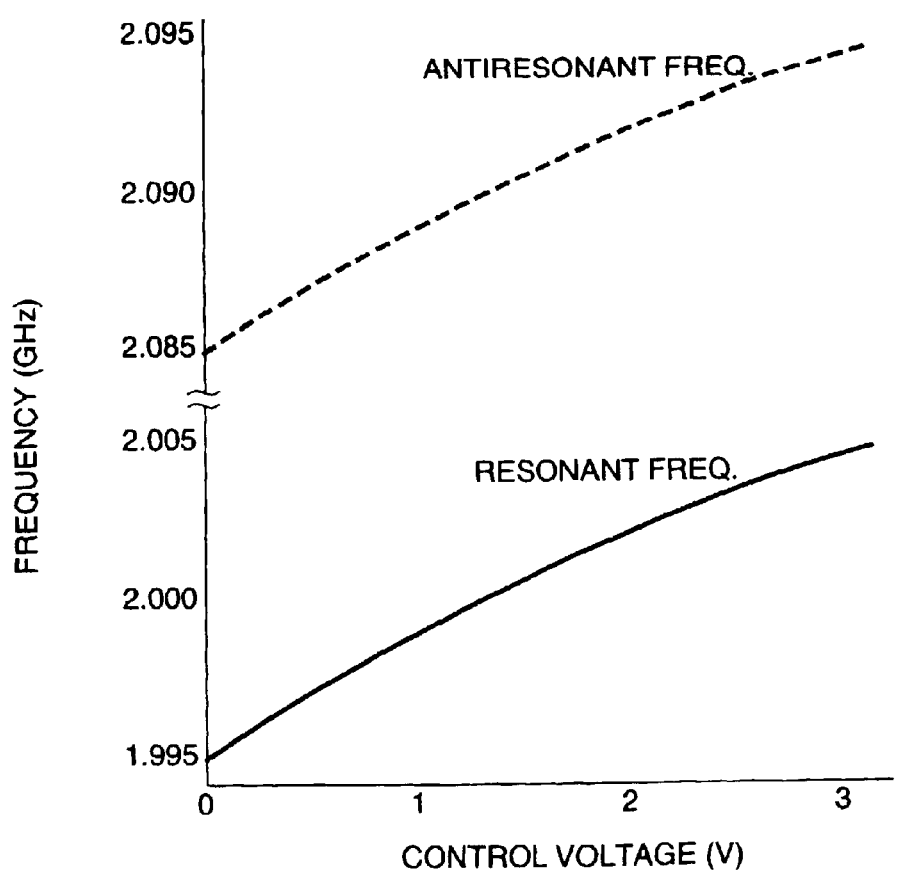
FIG. 2 is a graph showing the relation between the control voltage and the resonant frequency in the thin film bulk acoustic wave resonator relating to the embodiment 1 of the invention.

FIG. 2 shows the result of measurement of the resonant frequency and the anti-resonant frequency versus the control voltage in the thin film bulk acoustic wave resonator. In this case, the thickness of the ferroelectric film 7 was 1100 nm; the thickness of the lower electrode 3 was 100 nm; and the thickness of the upper electrode 5 was 150 nm.

As seen by FIG. 2, when the DC voltage is changed from 0.2 V to 3.0 V as the control voltage Vc, the resonant frequency varies from 1.995 GHz to 2.0055 GHZ, and the anti-resonant frequency varies from 2.85 GHz to 2.095 GHz. Namely, the changing rate of approximately 0.20%/V was observed for both the frequencies. Besides, the Q value becomes very high i.e. 900, so that oscillation with low phase noise is available.

Figure 3:
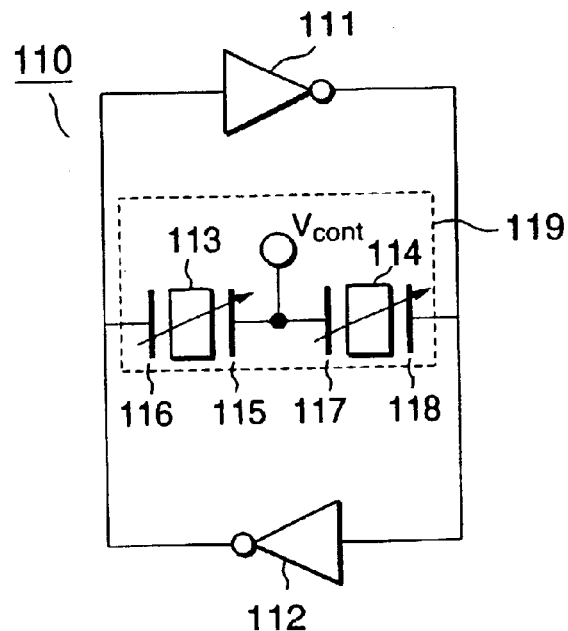
FIG. 3 is a block circuit diagram of the balanced type voltage controlled oscillator relating to the embodiment 1 of the invention.

FIG. 3 shows a fundamental block circuit diagram of a balanced type voltage controlled oscillator 110 employing two thin film bulk acoustic wave resonators.

As shown in FIG. 3, a series circuit 119 of a pair of thin film bulk acoustic wave resonators 113 and 114 is connected in parallel to the inside of an oscillation loop to which two inversion type amplifiers 111 and 112 are connected in series. The thin film bulk acoustic wave resonator 113 has electrodes 115 and 116, and the thin film bulk acoustic wave resonator 114 has electrodes 117 and 118.

The output frequency of the oscillator 110 can be changed because the anti-resonant frequencies of the thin film bulk acoustic wave resonators 113 and 114 can be changed by applying the control voltage Vcont to the electrodes 115 and 117. In this case, the electrode 116 and the electrode 118 have reverse phase relation to each other.

In the case of the balanced type voltage controlled oscillator, a loop gain of the oscillation circuit becomes the maximum in the vicinity of the anti-resonant frequency at which the impedances of the thin film bulk acoustic wave resonators 113 and 114 becomes the maximum, and then an oscillation takes place.

Figure 4:
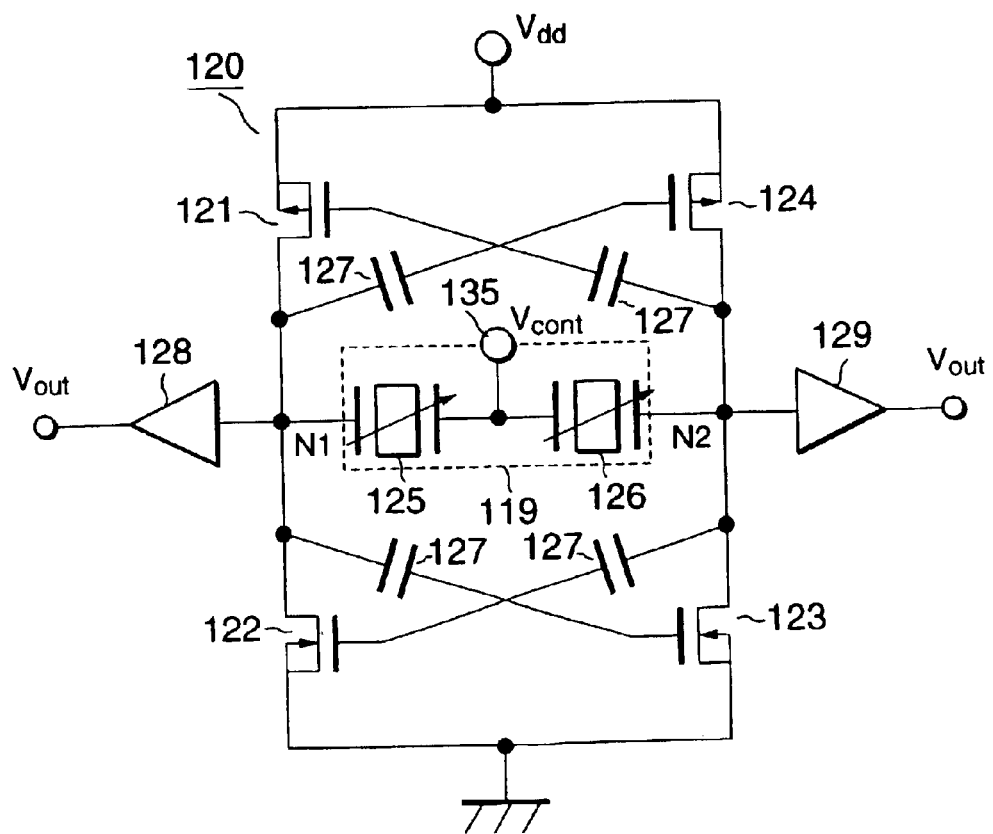
FIG. 4 is an equivalent circuit diagram of the balanced type voltage controlled oscillator relating to the embodiment 1 of the invention.

Next, FIG. 4 shows an equivalent circuit 120 when the inversion amplifiers 111 and 112 shown in FIG. 3 are formed with CMOS inverters.

As shown in FIG. 4, a CMOS inverter is formed with a P type MOS transistor 121 and an N type CMOS transistor 122, and another CMOS inverter is formed with a P type MOS transistor 123 and an N type CMOS transistor 124 in the same manner. The output of one CMOS inverter is connected to the input of the other CMOS inverter via a capacitor 127 for DC cutting. A source voltage Vdd is applied to both CMOS inverters.

A series circuit 119 of a pair of thin film bulk acoustic wave resonators 125 and 126 connected in series to each other is also connected in parallel to the loop of the CMOS inverter. Output buffer amplifiers 128 and 129 are connected to the output Vout.

The balanced type voltage controlled oscillator 120 employing such CMOS inverters has a very high Q value suitable for application in the variable range of the frequency lower than 10 MHz at 2 GHz band.

This balanced type voltage controlled oscillator employs a pair of the thin film bulk acoustic wave resonators, and electrodes having reverse phase relation to each resonator are connected to the balanced type oscillation loop. Therefore, two outputs with the same frequency and a phase reverse to each other suitable for the balanced type voltage controlled oscillator can be outputted.

(Embodiment 2)

Figure 5:
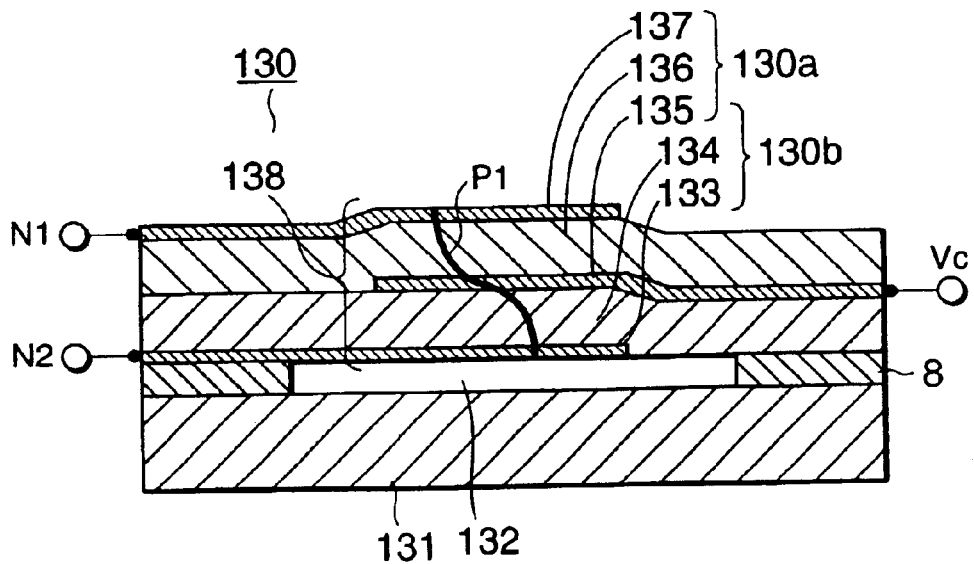
FIG. 5 is a cross section of the balanced type thin film bulk acoustic wave resonator relating to the embodiment 2 of the invention.

FIG. 5 shows a cross section of a pair of the thin film bulk acoustic wave resonators 130 relating to the embodiment 2 of the present invention.

This resonator is suitable for application to the balanced type voltage controlled oscillator, and the pair of the thin film bulk acoustic wave resonators are elastically coupled to each other in order to match the oscillations thereof. As for the thin film bulk acoustic wave resonator connected elastically, a structure of so-called stacked crystal filter layered in the direction of the thickness thereof and a structure of so-called monolithic crystal filter coupled in the direction of the surface thereof are possible. This embodiment is the stacked crystal filter structure.

To prepare the thin film bulk acoustic wave resonator as shown in FIG. 5, a sacrificial layer 8 of SrRuO3 is prepared on a silicon substrate 1 by epitaxial growth, and then a lower electrode 133 of iridium, a ferroelectric film 134 of barium titanate, an intermediate electrode 135 of iridium, a ferroelectric film 136 of barium titanate and an upper electrode 137 of iridium are also prepared thereon by epitaxial growth. Thereafter, the sacrificial layer 8 located under the part to become a resonance portion 138 is removed in order to form a cavity 132.

In this balanced type thin film bulk acoustic wave resonator, a first thin film bulk acoustic wave resonator 130a comprising the lower electrode 133, the ferroelectric thin film 134 and the intermediate electrode 135, and a second thin film bulk acoustic wave resonator 130b comprising the intermediate electrode 135, the ferroelectric thin film 136 and the upper electrode 137 are layered and share the intermediate electrode. The two thin film bulk acoustic wave resonators are elastically coupled to each other very firmly.

The thickness from the lower electrode 133 to the common intermediate electrode 135 corresponds to ¼ of the wavelength of the oscillation frequency, and also the thickness from the intermediate electrode 135 to the upper electrode 137 corresponds to ¼ of the wavelength of the oscillation frequency. Therefore, the thickness from the lower electrode 133 to the upper electrode 137 becomes a half of the wavelength of the oscillation frequency, and an oscillation takes place. Namely, two thin film bulk acoustic wave resonators having the fundamental resonant frequency that is twice the oscillation frequency are utilized.

As shown in FIG. 5, phase distribution P1 in the direction of the thickness says that the upper electrode 137 and the lower electrode 133 have a phase reverse to each other. Mounting the thin film bulk acoustic wave resonator between the node N1 and the node N2 of the voltage controlled oscillator 120 shown in FIG. 4, for example, can form a favorable balanced type voltage controlled oscillator.

Though a pair of the thin film bulk acoustic wave resonators used for the balanced type voltage controlled oscillator require thin film bulk acoustic wave resonators whose resonance properties are as uniform as possible in order to realize a high Q value oscillation, a little difference takes place in reality on such as the resonant frequency caused by fine deviation of film-forming condition etc., and this deviation deteriorates the oscillation property.

Because a pair of thin film bulk acoustic wave resonators are coupled together elastically to oscillate practically as the same oscillator, the oscillation property of very high purity can be obtained, so that the properties of the two outputs can be completely balanced with each other for the balanced type voltage controlled oscillator. Additionally, the oscillation frequency can be stably changed by changing the DC bias Vcont applied between the intermediate electrode 135 and the nodes N1, N2.

(Embodiment 3)

Figure 6:
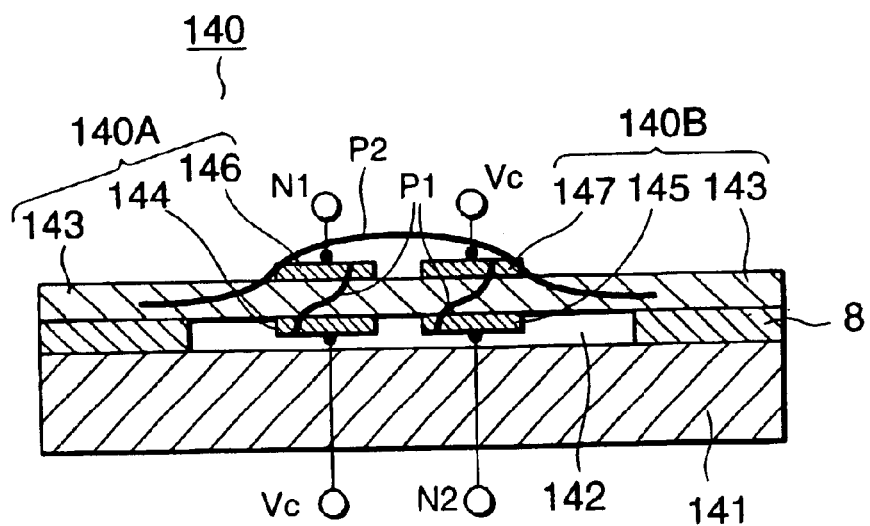
FIG. 6 is a cross section of the balanced type thin film bulk acoustic wave resonator relating to the embodiment 3 of the invention.
Figure 7:
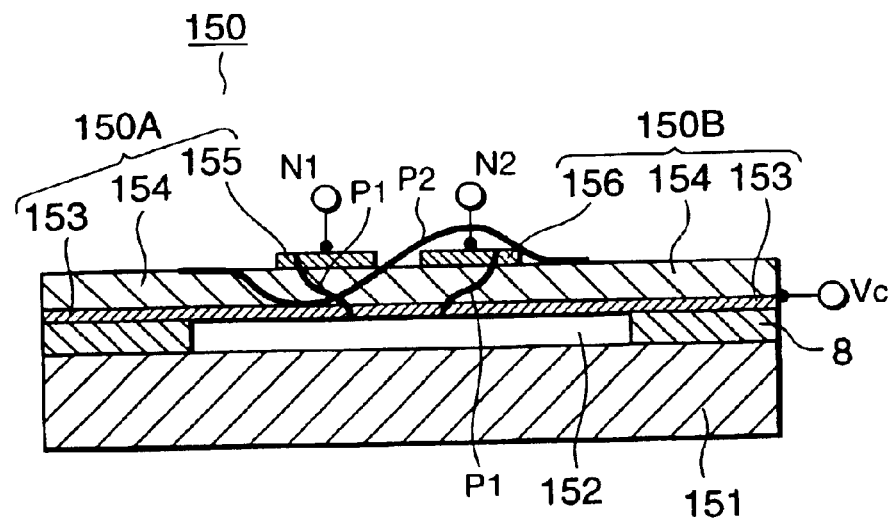
FIG. 7 is a cross section of the balanced type thin film bulk acoustic wave resonator relating to the embodiment 3 of the invention.

FIG. 6 and FIG. 7 show cross sections of a pair of the thin film bulk acoustic wave resonators relating to the embodiment 3 of the invention. These resonators are suitable for constructing the balanced type voltage controlled oscillator.

The resonators have a monolithic crystal filter structure coupled elastically in the direction of a plane.

As a coupling mode between two thin film bulk acoustic wave resonators located adjacent to each other in the piezoelectric film plane, there is a reverse symmetry mode (diagonal symmetry or A mode) where adjacent resonators have a phase reverse to each other, or a symmetry mode (S mode) where the above resonators have the same phase, for bulk longitudinal vibration. Selection of the modes depends on the distance between the electrodes, the dimension of the electrodes, elastic matrix of the piezoelectric material and constraint conditions of the circumference.

Two resonators using the balanced type voltage controlled oscillator employ the same ferroelectric film and are located in the plane adjacent to each other so as to couple together elastically.

In consequence, two outputs vibrating at the same frequency with a phase reverse to each other can be constructed by being elastically coupled to each other completely.

FIG. 6 is a cross-sectional pattern diagram of arrangement of the monolithic crystal filter structure when the symmetry mode is used.

As shown in FIG. 6, a lower electrode 144, a lower electrode 145, a ferroelectric film 143, an upper electrode 146, and an upper electrode 147 are formed over a cavity 142 formed on a silicon substrate 141. These components constitute thin film bulk acoustic wave resonators 140A and 140B.

The first thin film bulk acoustic wave resonator 140A comprised of the lower electrode 144, the ferroelectric film 143, and the upper electrode 146, and the second thin film bulk acoustic wave resonator 140B comprised of the lower electrode 145, the ferroelectric film 143, and the upper electrode 147 are located adjacent to each other.

As shown in FIG. 6 additionally, the thin film bulk acoustic wave resonators are elastically coupled together firmly in order that the two thin film bulk acoustic wave resonators may have the same phase with regard to the phase distribution P2 in the plane. P1 represents the phase distribution in the direction of the thickness.

Accordingly, a favorable balanced type voltage controlled oscillator can be formed by connecting the upper electrode 146 and the lower electrode 143, both of which have a phase reverse to each other, to the node N1 and the N2 shown in FIG. 4 respectively, and applying the control voltage Vc between the upper electrode 147 and the lower electrode 144.

FIG. 7 is a cross-sectional pattern diagram of a pair of thin film bulk acoustic wave resonators 150 in the arrangement of the monolithic crystal filter structure when the reverse symmetry mode is adopted.

As shown in FIG. 7, a lower electrode 153, a ferroelectric film 154, an upper electrode 155, and an upper electrode 156 are formed over a cavity 152 formed on a silicon substrate 151. These components constitute a thin film bulk acoustic wave resonator.

A first thin film bulk acoustic wave resonator 150A comprised of the lower electrode 153, the ferroelectric film 154, and the upper electrode 155, and a second thin film bulk acoustic wave resonator 150B comprised of the lower electrode 153, the ferroelectric film 154, and the upper electrode 156 are located adjacent to each other.

As shown in FIG. 7 additionally, the thin film bulk acoustic wave resonators are elastically coupled together firmly in order that the two thin film bulk acoustic wave resonators may have a phase reverse to each other with regard to the phase distribution P2 in the plane. P1 represents the phase distribution in the direction of the thickness.

Accordingly, a favorable balanced type voltage controlled oscillator can be formed by connecting the upper electrode 155 and the upper electrode 157, both of which have a phase reverse to each other, to the node N1 and the node N2 shown in FIG. 4 respectively, and applying a control voltage Vc to the common lower electrode 153.

Structure of the thin film bulk acoustic wave resonator is not limited to the structures shown in FIG. 5 to FIG. 7. Diverse variations can be put to practical use on the condition that at least a pair of the thin film bulk acoustic wave resonators coupled elastically to each other are positioned and the electrodes of respective thin film bulk acoustic wave resonators, which have a phase reverse to each other are connected to the complementary connection points N1 and N2 of the oscillation loop respectively.

For example, so-called solidly mounted resonator having a Bragg reflection layer can also be utilized instead of the cavity located under the resonant portion.

(Embodiment 4)

Figure 8:
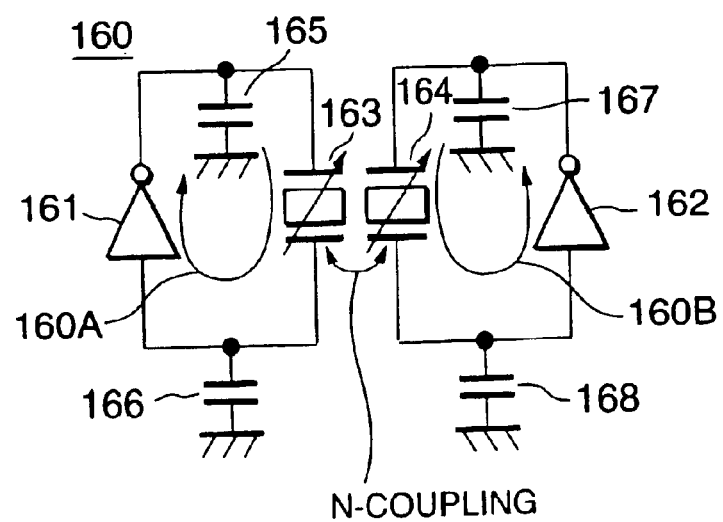
FIG. 8 is a block circuit diagram of the balanced type voltage controlled oscillator relating to the embodiment 4 of the invention.

FIG. 8 shows a circuit diagram of the balanced type voltage controlled oscillator 160 relating to the fourth embodiment of the invention.

In this balanced type voltage controlled oscillator, a first oscillation loop 160A comprised of an inversion type amplifier 161 and a thin film bulk acoustic wave resonator 163, and a second oscillation loop 160B comprised of an inversion type amplifier 162 and a thin film bulk acoustic wave resonator 164 are formed, the thin film bulk acoustic wave resonator 163 and the thin film bulk acoustic wave resonator 164 are elastically coupled to each other with reverse phase relation (N-coupling).

Both ends of the thin film bulk acoustic wave resonators are grounded through capacitors 165, 166, 167, and 168 in order that the phase rotation angle of the entire loop may be $2\pi$, which is the oscillating condition, by inverting the phase as the whole passive elements together with the inversion amplifier.

Because the amplifiers 161, 162 and the thin film bulk acoustic wave resonators 163, 164 are connected together in series in the circuit construction of a fundamental block 160, loop gains of the oscillation circuits become the maximum in the vicinity of the resonant frequency at which the impedances of the thin film bulk acoustic wave resonators 163, 164 become the minimum, and the oscillation takes place.

Figure 9:
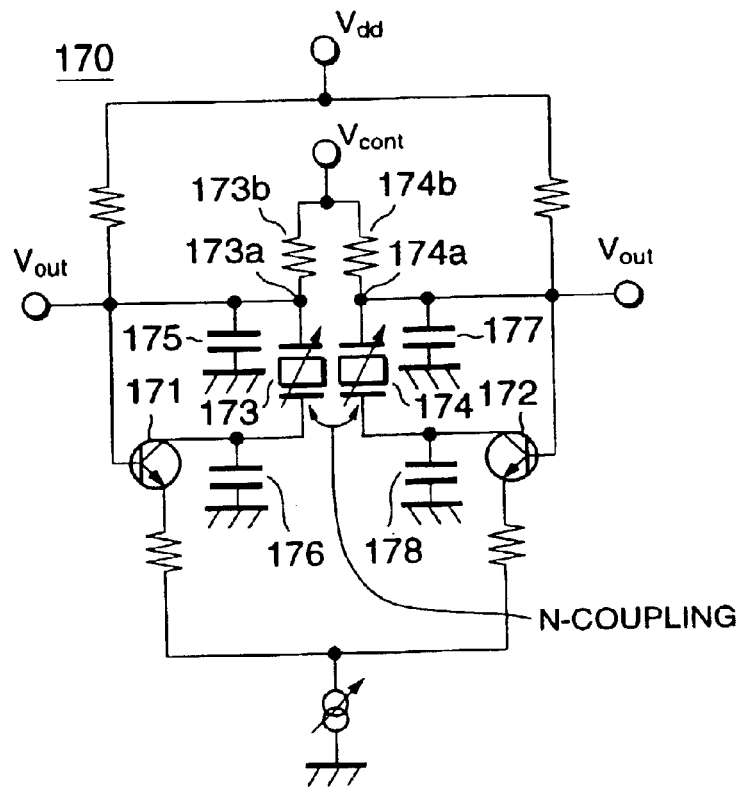
FIG. 9 is an equivalent circuit diagram of the balanced type voltage controlled oscillator relating to the embodiment 4 of the invention.

Then, FIG. 9 shows an equivalent circuit 170 that the inversion amplifiers 161 and 162 of the fundamental block 160 in FIG. 8 are formed by NPN bipolar transistors.

The first oscillation loop comprised of an NPN bipolar transistor 171 and a thin film bulk acoustic wave resonator 173, and the second oscillation loop comprised of an NPN bipolar transistor 172 and a thin film bulk acoustic wave resonator 174 are formed, and the thin film bulk acoustic wave resonator 173 and the thin film bulk acoustic wave resonator 174 are elastically coupled to each other with reverse phase relation (N-coupling).

The control voltage Vcont for changing the oscillation frequency is applied to electrodes 173a, 174a of the thin film bulk acoustic wave resonators 173, 174 via resistors 173b, 174b, and the respective other electrodes have a phase reverse to each other.

The balanced type voltage controlled oscillator having a very high Q value suitable for application in a variable range of the frequency equal to or lower than 10 MHz at 2 GHz band can be constructed by employing such voltage controlled oscillator and oscillation circuit.

(Embodiment 5)

Figure 10:
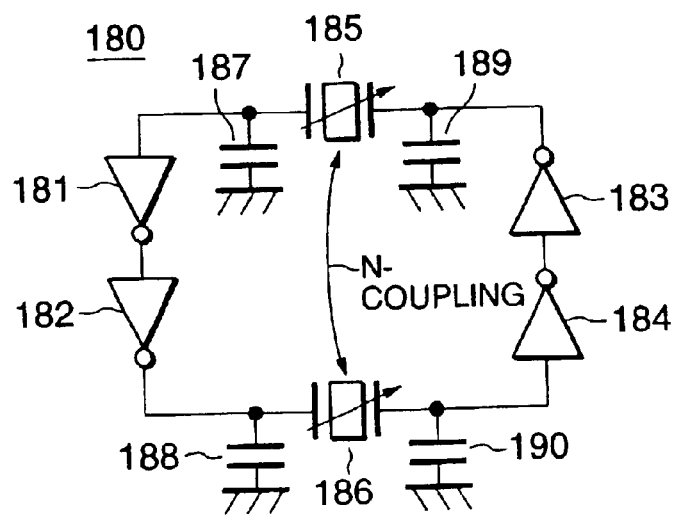
FIG. 10 is a block circuit diagram of the voltage controlled oscillator relating to the embodiment 5 of the invention.

FIG. 10 shows a fundamental block circuit diagram 180 of the balanced type voltage controlled oscillator relating to the embodiment 5 of the present invention.

In this balanced type voltage controlled oscillator, inversion type amplifiers 181, 182, 183 and 184, and thin film bulk acoustic wave resonators 185 and 186 are connected all together in series to form an oscillation loop. The thin film bulk acoustic wave resonators 185 and 186 are elastically coupled to each other with reverse phase relation.

Both ends of the thin film bulk acoustic wave resonators 185 and 186 are grounded via capacitors 187, 189, 188 and 190 in order that phase rotation angle of the entire loop may be $2n\pi$ (n is integer), which is the oscillating condition, by inverting the phase as each thin film bulk acoustic wave resonator together with the inversion amplifier.

Because the inversion type amplifiers 181, 182, 183 and 184, and the thin film bulk acoustic wave resonators 185, 186 are connected all together in series in the circuit of a fundamental block 180, a loop gain of the oscillation circuit becomes the maximum in the vicinity of the resonant frequency at which the impedances of the thin film bulk acoustic wave resonators become the minimum, and an oscillation takes place.

Figure 11:
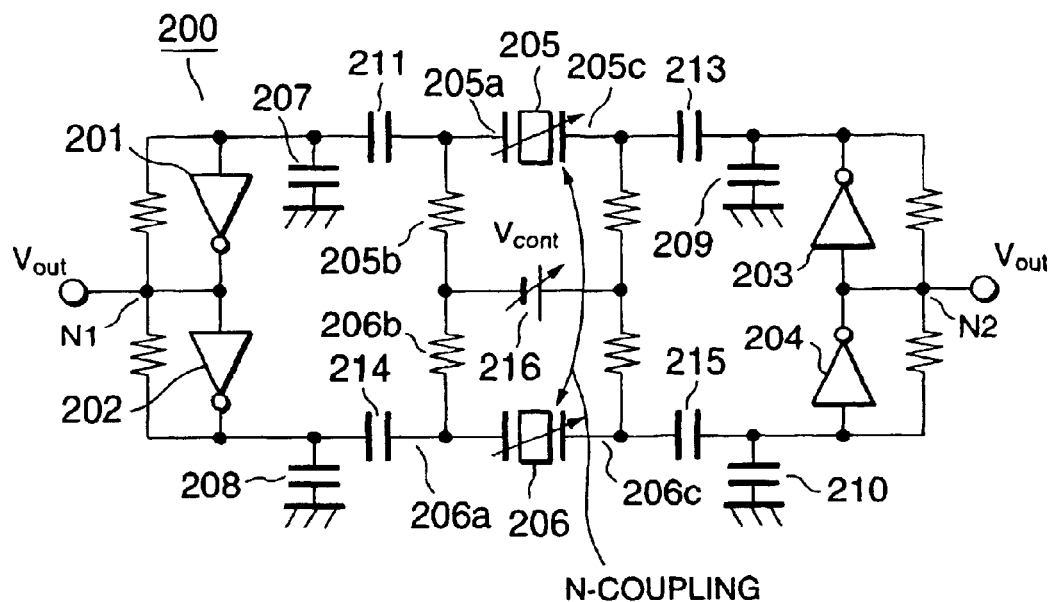
FIG. 11 is an equivalent circuit diagram of the voltage controlled oscillator relating to the embodiment 6 of the invention.

Then, FIG. 11 shows an equivalent circuit when the inversion amplifiers 181, 182, 183 and 184 of the fundamental block 180 in FIG. 10 are formed with CMOS inverters.

CMOS inverters 201, 202, 203 and 204, and thin film bulk acoustic wave resonators 205 and 206 are connected all together in series to form an oscillation loop. The thin film bulk acoustic wave resonators 205 and 206 are elastically coupled to each other with reverse phase relation.

A control voltage Vcont is applied to one side electrodes 205a, 206a of the thin film bulk acoustic wave resonators 205, 206 from a control voltage circuit 216 via resistors 205b, 206b, and the other side electrodes have a phase reverse to each other.

The balanced type voltage controlled oscillator having a very high Q value suitable for application in a variable range of the frequency equal to or lower than 10 MHz at 2 GHz band can be constructed by employing such thin film bulk acoustic wave resonator and oscillation circuit.

This balanced type voltage controlled oscillator forms two independent oscillation loops, each of which is electrically isolated to the other, wherein they resonate at a frequency in the vicinity of the resonant point of the thin film bulk acoustic wave resonators.

The balanced type voltage controlled oscillator having two outputs whose frequencies are the same with a phase reverse to each other can be realized because a pair of the thin film bulk acoustic wave resonators forming the two oscillation loops are elastically coupled with a phase reverse to each other.

One oscillation loop is formed by connecting two or more of amplifiers and a pair of the thin film bulk acoustic wave resonators all together in series, so that an oscillation takes place in the vicinity of the resonant frequency where the impedances of the thin film bulk acoustic wave resonators become the minimum. The balanced type voltage controlled oscillator having two outputs whose frequencies are the same with a phase reverse to each other can be realized by making the two nodes N1, N2 with a phase reverse to each other in the oscillation loop be the output points.

(Embodiment 6)

Figure 12:
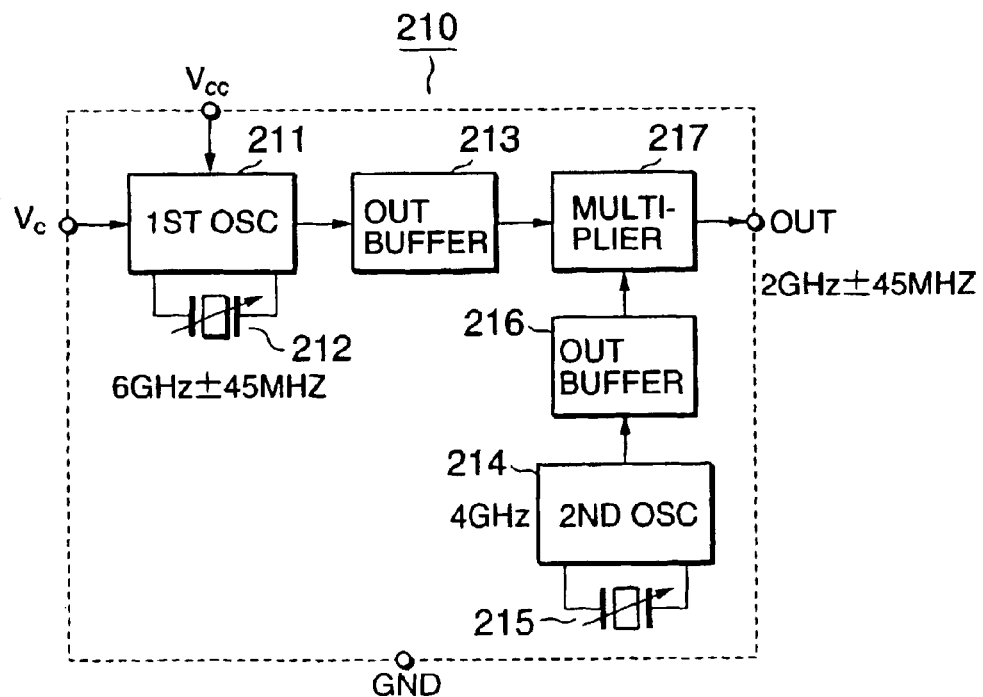
FIG. 12 is a block circuit diagram of the voltage controlled oscillator relating to the embodiment 6 of the invention.

FIG. 12 is a block diagram of the voltage controlled oscillator 210 relating to the embodiment 6.

As shown in FIG. 12, a voltage controlled oscillator 210 comprises a ground terminal GND for grounding, a source terminal Vcc to which a source voltage Vcc is fed, a control terminal Vc to which a control voltage Vc for the thin film bulk acoustic wave resonator is supplied, and an output terminal out outputting an oscillation signal, as input-output terminals.

The voltage controlled oscillator 210 comprises a first oscillation circuit 211 having a thin film bulk acoustic wave resonator 212 and oscillating a frequency variable in accordance with the control voltage vc, a second oscillation circuit 214 having a thin film bulk acoustic wave resonator 215 and oscillating a fixed frequency, a multiplier 217 acting as a mixer to output the difference of the frequency of the first oscillation circuit and the frequency of the second oscillation circuit, an output buffer 213 certifying isolation between the first oscillation circuit 211 and the multiplier 217, and an output buffer 216 certifying isolation between the second oscillation circuit 214 and the multiplier 217.

Here, for the oscillation circuits 211 and 214, the balanced type voltage control oscillation circuits explained in the embodiment 2 to the embodiment 5 can be employed.

Figure 13:
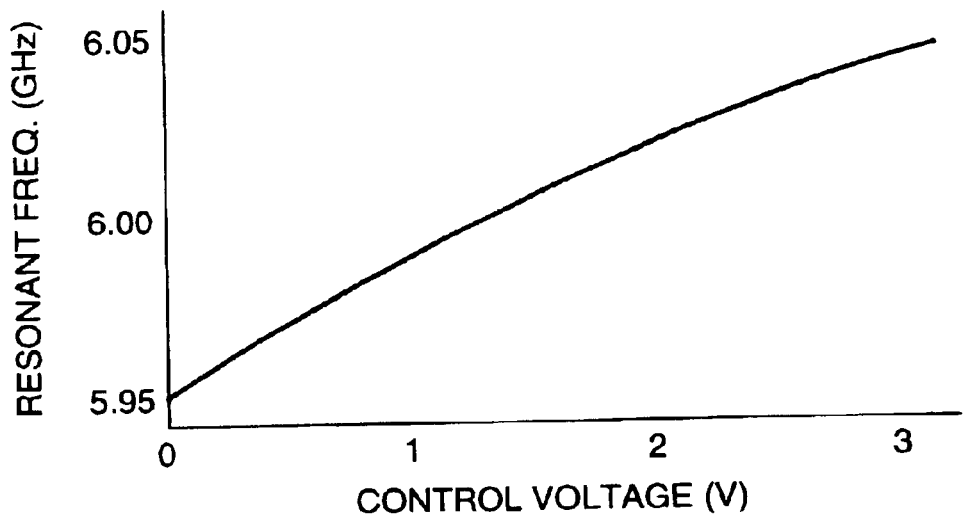
FIG. 13 is a graph showing the relation between the control voltage and the oscillation frequency of the voltage controlled oscillator relating to the embodiment 6 of the invention.

FIG. 13 shows the result of measurement of the oscillation frequency versus the control voltage in the thin film bulk acoustic wave resonator 212. The resonator has the structure shown in FIG. 1, wherein the thickness of the ferroelectric thin film 4 is 230 nm; the thickness of the lower electrode 3 is 25 nm; the thickness of the upper electrode 5 is 50 nm; and the load capacitance of the first oscillation circuit 211 is 9 pF.

As seen in FIG. 13, variable range of the resonant frequency of 6.00±0.045 GHz was obtained when the control voltage was 0.2 V to 3.0 V.

In the thin film bulk acoustic wave resonator 215, frequency of 4 GHz was obtained as the oscillation frequency of the second oscillator 214 in the case where the control voltage was not applied thereto, on the condition that the thickness of the ferroelectric thin film 4 was 310 nm; the thickness of the lower electrode 3 was 35 nm; and the thickness of the upper electrode 5 was 72 nm in the structure shown in FIG. 1.

A relatively wide variable range of the frequency to the oscillation frequency could be assured by inputting the outputs of the first oscillation circuit 211 and the second oscillation circuit 214 into the multiplier 217 through the output buffers 213 and 216 respectively in order to output the difference of the outputs of both oscillation circuits.

The output frequency of 2 GHz±45 MHz could be obtained in this embodiment. Properties required for a voltage controlled oscillator for W-CDMA (Wide-band Code Division Multiple Access) could be satisfied.

Figure 14:
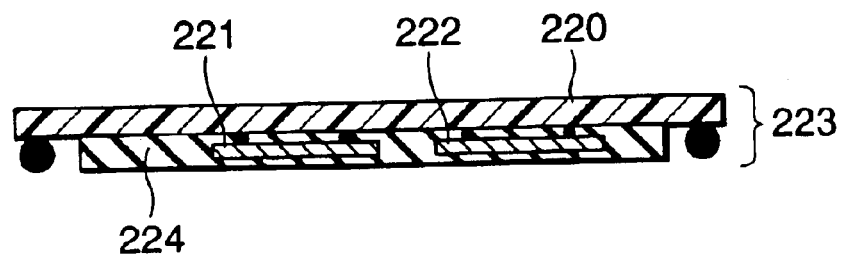
FIG. 14 is a pattern cross section showing the mounting figuration of the voltage controlled oscillator relating to the embodiment 6 of the invention.

FIG. 14 is a cross section of a package in which the oscillation circuit and the multiplier (mixer circuit) are mounted on the same package.

As shown in FIG. 14, a thin film bulk acoustic wave resonator, capacitors, resistors and inductors used for an oscillation circuit are formed on an insulative Si substrate. Furthermore, passive elements such as capacitors, resistors and inductors used for an output buffer are formed all together to construct a passive chip 220. On the surface, a high frequency semiconductor IC 221 accommodating two oscillation circuits and an output buffer circuit, and a high frequency semiconductor IC 222 accommodating a mixer circuit are mounted and molded with a sealing resin 224.

The IC 221 accommodating mainly transistors used for the oscillation circuit and transistors used for the output buffer, and moreover the IC 222 accommodating mainly transistors used for the mixer are connected together through a bump, as is a bare chip, and sealed as a unit to be a module 223.

By modularizing in the form of chip-on-chip, a voltage controlled oscillator packaged with a very small size and high density could be formed.

As mentioned above, a plurality of the balanced type voltage controlled oscillators and the multiplier to output the difference of the output frequencies from the voltage controlled oscillators are provided, and the voltage controlled oscillators and the multiplier are sealed and mounted on the same substrate.

(Embodiment 7)

Figure 15:
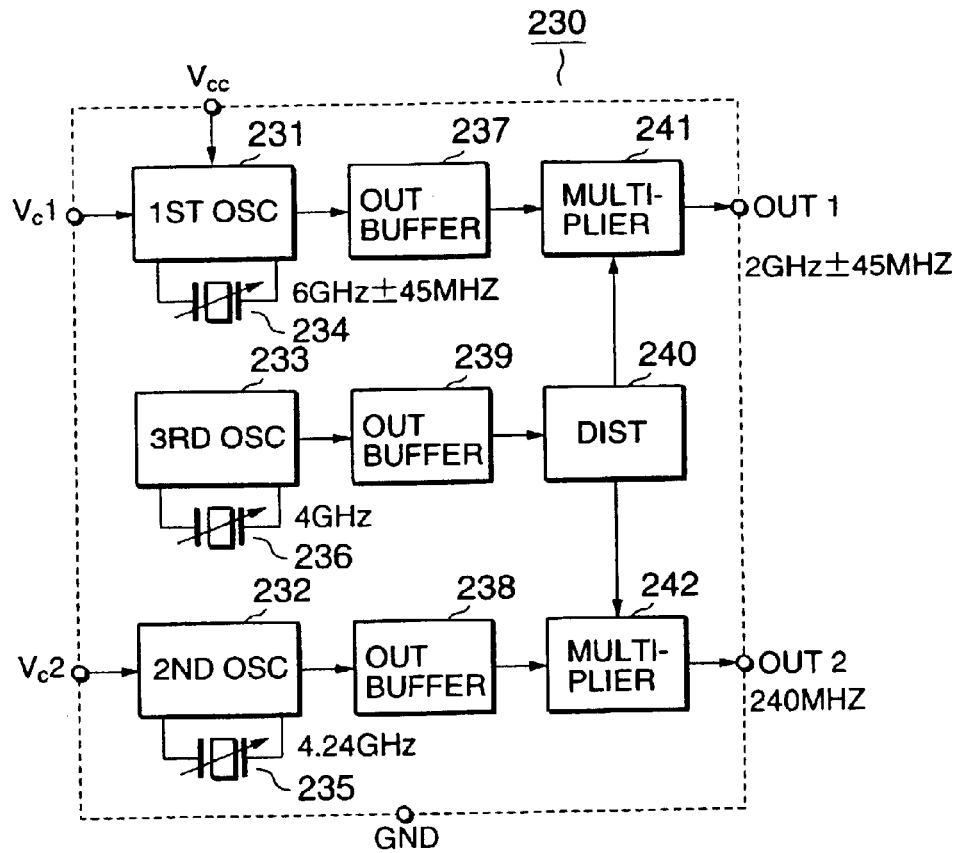
FIG. 15 is a block circuit diagram of the voltage controlled oscillator relating to the embodiment 7 of the invention.

FIG. 15 shows a block diagram of the voltage controlled oscillator 230 relating to the embodiment 7 of the invention.

This voltage controlled oscillator 230 relates to the dual mode voltage controlled oscillator capable of outputting two frequencies, i.e. RF frequency and IF frequency.

As shown in FIG. 15, the voltage controlled oscillator 230 comprises a ground terminal GND for grounding, a source terminal Vcc to which a source voltage is fed, a control terminal Vc1 to which a first control voltage Vc1 is supplied, a control terminal Vc2 to which a second control voltage Vc2 is supplied, an output terminal Out1 outputting a first oscillation signal, and an output terminal Out2 outputting a second oscillation signal.

Furthermore, the voltage controlled oscillator 230 comprises a first oscillation circuit 231 having a thin film bulk acoustic wave resonator 231 to oscillate a frequency varying in accordance with the control voltage Vc1, an output buffer 237 securing isolation between the first oscillation circuit 231 and a multiplier 241, a second oscillation circuit 232 having a thin film bulk acoustic wave resonator 235 to oscillate a frequency varying in accordance with the control voltage Vc2, an output buffer 238 securing isolation between the second oscillation circuit 232 and a multiplier 242, a third oscillation circuit 233 having a thin film bulk acoustic wave resonator 236 to oscillate a fixed frequency, a distributor 240 distributing the output from the third oscillation circuit 233 to the two multipliers, and an output buffer 239 securing isolation between the third oscillation circuit 233 and the distributor 240. The multiplier 241 outputs the difference between the frequency of the first oscillation circuit 231 and the third oscillation circuit 233, and the multiplier 242 outputs the difference between the frequency of the second oscillation circuit 232 and the third oscillation circuit 233.

Here, the first, the second and the third oscillation circuits 231, 232, and 233 can employ one of the balanced type voltage controlled oscillators explained in the embodiment 2 to the embodiment 5.

In the first thin film bulk acoustic wave resonator 234, variable range of 6.00±0.045 GHz of the resonant frequency was obtained when the control voltage Vc1 was 0.2 V to 3.0 V, on the condition that the thickness of the ferroelectric thin film 4 was 230 nm; the thickness of the lower electrode was 25 nm; and the thickness of the upper electrode was 50 nm.

In the second thin film ferroelectric resonator 235, the resonant frequency of approximately 4.25 GHz was obtained on the condition that the thickness of the ferroelectric film was 330 nm; the thickness of the lower electrode was 25 nm; and the thickness of the upper electrode was 50 nm.

In the third thin film bulk acoustic wave resonator 236, the resonant frequency of 4 GHz was obtained when the control voltage was not applied thereto, on the condition that the thickness of the ferroelectric film was 330 nm; the thickness of the lower electrode was 25 nm; and the thickness of the upper electrode was 50 nm.

A relatively wide variable range of the frequency to the oscillation frequency was assured by inputting the outputs of the first oscillation circuit 231 and the third oscillation circuit 233 into the multiplier through the output buffers and the distributor respectively in order to output the difference of the outputs of both oscillation circuits.

Thus, the output frequency of 2 GHz+45 MHz could be obtained. In consequence, properties required for the voltage controlled oscillator for W-CDMA could be substantially satisfied.

In addition, the oscillation frequency of approximately 240 MHz was obtained by inputting the outputs of the second oscillation circuit 232 and the third oscillation circuit 233 into the multiplier through the output buffers and the distributor respectively in order to output the difference of the outputs of both oscillation circuits. Although the thickness of the ferroelectric member of the voltage controlled oscillator must be equal to or greater than 5000 nm to oscillate this frequency with a single oscillation circuit, this embodiment can get the same frequency with an extremely thin thickness of the ferroelectric material by employing the two oscillation circuits. Therefore, the voltage controlled oscillator can be prepared in a short time and also becomes very easy technologically.

Additionally, when the first and the second oscillation circuits 231 and 232 oscillate simultaneously two kinds of frequencies independently to each other, any mutual interaction occurring in the case where inductors and capacitors are used does not take place, and consequently a stable oscillation can be obtained.

(Embodiment 8)

Figure 16:
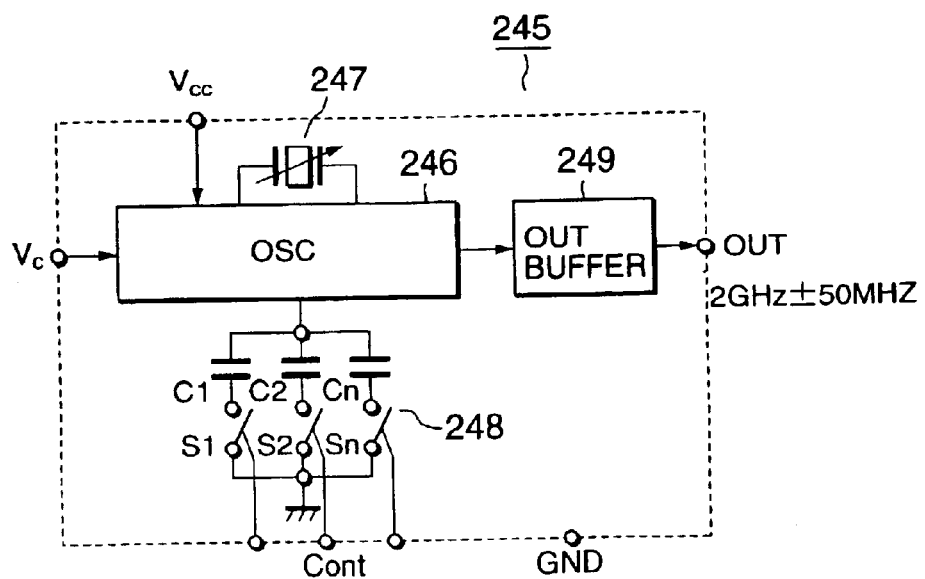
FIG. 16 is a block circuit diagram of the voltage controlled oscillator relating to the embodiment 8 of the invention.

FIG. 16 shows a block diagram of the voltage controlled oscillator 245 relating to the embodiment of the invention.

As shown in FIG. 16, the voltage controlled oscillator 245 comprises a ground terminal GND for grounding, a source terminal Vcc to which a source voltage Vcc is fed, a control terminal Vc to which a control voltage Vc is supplied, a control terminal Cont to which a switch control signal for changing the frequency is applied, and an output terminal Out outputting an oscillation signal.

Besides, the voltage controlled oscillator 245 comprises an oscillation circuit 246 comprising a thin film bulk acoustic wave resonator 247 and a capacitance regulating circuit 248, and oscillating a frequency variable in accordance with the control voltage Vc, and an output buffer 249 securing isolation between the oscillation circuit 246 and the output terminal Out.

Here, the thin film bulk acoustic wave resonator 247 and capacitors C1 to Cn to be selected by switches S1 to Sn whose on-off operation from the capacitance regulating circuit 248 is dependent upon the control signal are being used as resonant elements in the oscillation circuit.

The oscillation frequency can be controlled by the aid of following two kinds of means, i.e. means for applying a DC bias voltage corresponding to the control voltage Vc between the two electrodes of the thin film bulk acoustic wave resonator 247, and means for selecting the capacitance value in the capacitance regulating circuit.

For the capacitances of the capacitors C1 to Cn contained in the capacitance regulating circuit 248, it is desirable that a small number of capacitors can cover a wide changing range of capacitance by using for example a multiple series.

Figure 17:
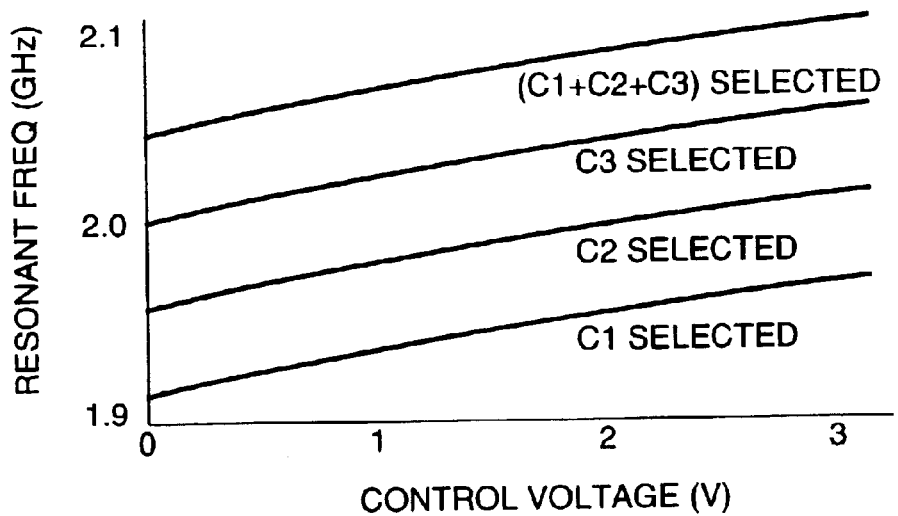
FIG. 17 is a graph showing the relation between the control voltage and the oscillation frequency of the voltage controlled oscillator relating to the embodiment 8 of the invention.

FIG. 17 shows the relation of the control voltage to the resonant frequency for the thin film bulk acoustic wave resonator 247. Here, the thickness of the ferroelectric film was 110 nm; the thickness of the lower electrode was 15 nm; the thickness of the upper electrode was 20 nm; and C1 to C3 of the capacitance regulating circuit were 2 pF, 4 pF and 8 pF respectively.

As shown in FIG. 17, variable range of the resonant frequency of 2.00±0.08 GHz was recognized by measuring the resonant frequency for the control voltage Vc of 0.2 V to 3.0 V when the capacitor(s) of the capacitance regulating circuit was (were) switched to the case of C1 being used, the case of C2 being used, the case of C3 being used, or the case of C1+C2+C3 being used.

This embodiment comprises a thin film bulk acoustic wave resonator and a plurality of capacitors as resonant elements of the voltage controlled oscillator, and means for selecting and switching a certain capacitor out of the above plural capacitors in accordance with an external control signal Cont. A resonant circuit of a series circuit or a parallel circuit is constructed by employing a thin film bulk acoustic wave resonator and a capacitor or capacitors selected from the above plural capacitors with different fixed capacitances in accordance with an external signal. Frequency control corresponding to channel selection is carried out by selection of the capacitor(s). Fine adjustment of the frequency is performed by applying the control voltage to the voltage controlled oscillator. Consequently, the voltage controlled oscillator having frequencies of wide variable range is realized, and extremely low phase noise can also be accomplished because no varactors are used.

(Embodiment 9)

Figure 18:
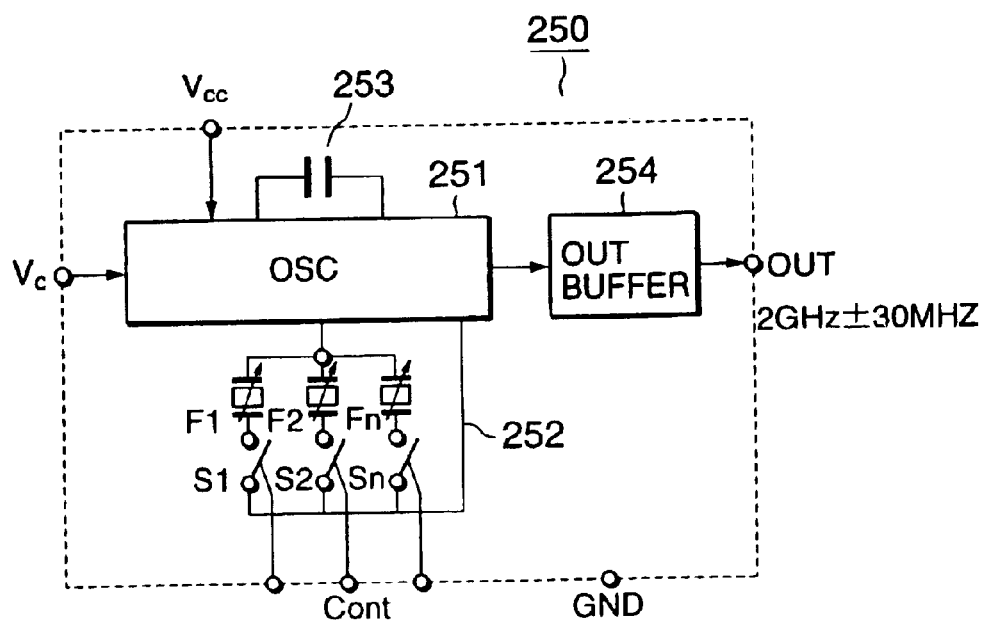
FIG. 18 is a block circuit diagram of the voltage controlled oscillator relating to the embodiment 9 of the invention.

FIG. 18 shows a block diagram of the voltage controlled oscillator relating to the embodiment 9 of the invention.

As shown in FIG. 18, the voltage controlled oscillator 250 comprises a ground terminal GND for grounding, a source terminal Vcc to which a source voltage Vcc is fed, a control terminal Vc to which a control voltage Vc is supplied, a control terminal Cont to which a switch control signal for changing the frequency is applied, and an output terminal Out outputting an oscillation signal.

The voltage controlled oscillator 250 further comprises a thin film bulk acoustic wave resonator selecting circuit 252 having a plurality of thin film bulk acoustic wave resonators F1 to Fn, an oscillation circuit 251 having a fixed capacitor 253 and oscillating a frequency variable in accordance with the control voltage Vc, and an output buffer 254 securing isolation between the oscillation circuit 251 and the output terminal.

Here, the fixed capacitors 253 and the thin film bulk acoustic wave resonators F1 to Fn to be selected by the switches S1 to Sn whose on-off operation from the thin film bulk acoustic wave resonator 252 is dependent upon the control signal are being used as resonant elements in the oscillation circuit. The oscillation frequency in a wide range can be controlled by following two kinds of means, i.e. means for selecting the thin film bulk acoustic wave resonator having a different central resonant frequency with the aid of the thin film bulk acoustic wave resonator selecting circuit, and means for applying a DC bias voltage corresponding to the control voltage Vc between the two electrodes of the thin film bulk acoustic wave resonator.

The central resonant frequencies of the thin film bulk acoustic wave resonators F1 to Fn contained in the thin film bulk acoustic wave resonator selecting circuit 252 are preferably arranged for example with the same interval to the adjacency thereof.

In this embodiment, eight thin film bulk acoustic wave resonators F1 to F8 were employed, wherein the thickness 110 nm of the ferroelectric film and the thickness 15 nm of the lower electrode were common to those resonators and the thickness of the upper electrode thereof was changed in the range from 15 nm to 45 nm with the same interval. As a result, the central frequency of each thin film bulk acoustic wave resonator was positioned in the range between 1.972 GHz and 2.029 GHz with the interval of 8 MHz. Furthermore, because each central frequency could be changed by 8.5 MHz by applying the control voltage between the upper electrode and the lower electrode, continuous variable range for the resonant frequency of 1.968 GHz to 2.033 GHz was obtained as a whole.

This embodiment comprises a plurality of the thin film bulk acoustic wave resonators as the resonant elements of the voltage controlled oscillator, and means for selecting a certain thin film bulk acoustic wave resonator out of the plural thin film bulk acoustic wave resonators in accordance with the external control signal. The resonant circuit is constructed by employing a thin film bulk acoustic wave resonator selected from the plural thin film bulk acoustic wave resonators using ferroelectric materials with different central resonant frequencies in accordance with an external signal, and a capacitor with a fixed capacitance. Frequency control corresponding to channel selection is carried out by selection of the thin film bulk acoustic wave resonator. Fine adjustment of the frequency is performed by applying the control voltage to the thin film bulk acoustic wave resonator. Consequently, the voltage controlled oscillator having the frequencies of wide variable range is realized, and extremely low phase noise can also be accomplished because no varactors are used.

(Embodiment 10)

Figure 19:
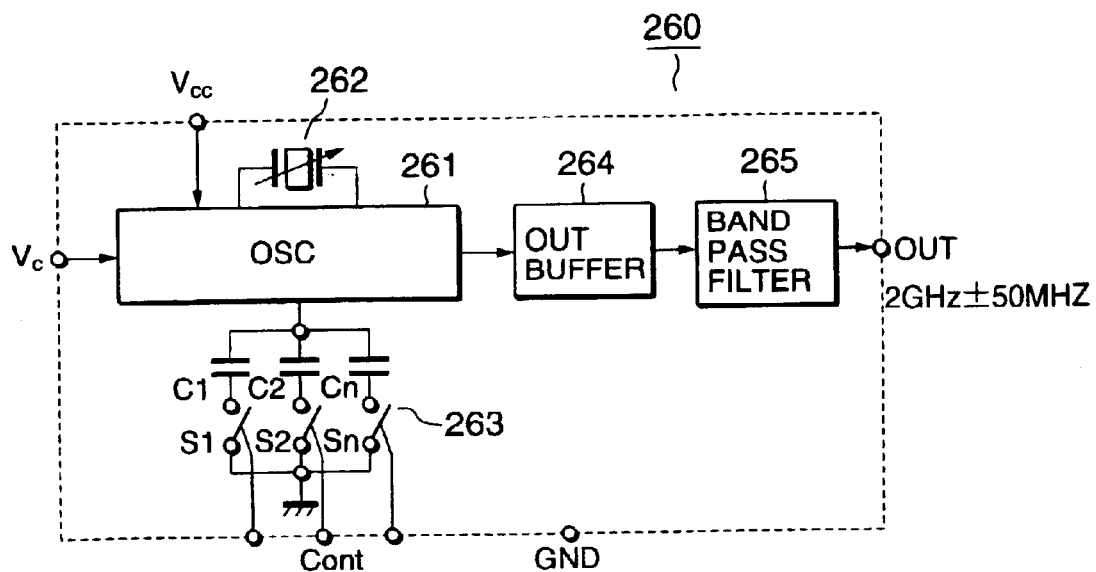
FIG. 19 is a block circuit diagram of the voltage controlled oscillator relating to the embodiment 10 of the invention.

FIG. 19 shows a block diagram of the voltage control oscillation circuit relating to the embodiment 10 of the invention.

As shown in FIG. 19, the voltage controlled oscillator 260 comprises a ground terminal GND for grounding, a source terminal Vcc to which a source voltage Vcc is fed, a control terminal Vc to which a control voltage Vc is supplied, a control terminal Cont to which a switch control signal for changing the frequency is applied, and an output terminal Out outputting an oscillation signal.

The voltage controlled oscillator 260 further comprises an oscillation circuit 261 having a thin film bulk acoustic wave resonator 262 and a capacitance regulating circuit 263 and oscillating a frequency variable in accordance with a control voltage Vc, a band pass filter 265 for removing a ripple component of the oscillation circuit 261, and an output buffer 264 securing isolation between the oscillation circuit 261 and the band pass filter 265.

Here, in the same way as the embodiment 6, the thin film bulk acoustic wave resonator 262 and capacitors C1 to Cn to be selected by switches S1 to Sn whose on-off operation from the capacitance regulating circuit 263 is dependent upon a control signal are being used as resonant elements in the oscillation circuit. The oscillation frequency can be controlled by following two kinds of means, i.e. means for applying a DC bias voltage corresponding to the control voltage Vc between the two electrodes of the thin film bulk acoustic wave resonator, and means for selecting a capacitance value in the capacitance regulating circuit.

Figure 20:
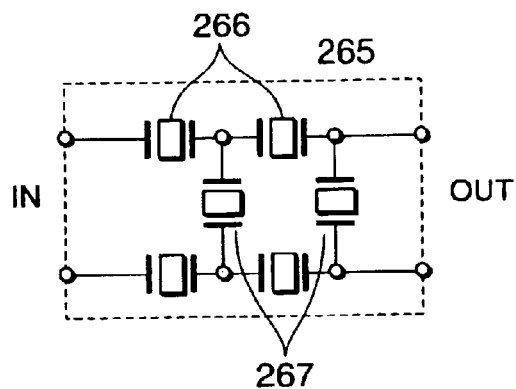
FIG. 20 is a circuit diagram of the symmetrical ladder type band pass filter used for the embodiment 10 of the invention.

FIG. 20 shows a symmetric ladder type band pass filter 265. This symmetric type band pass filter 265 is a full ladder type one comprising two sets of two thin film bulk acoustic wave resonators 266 connected together in series and two thin film bulk acoustic wave resonators 267 connected together in parallel.

Figure 21:
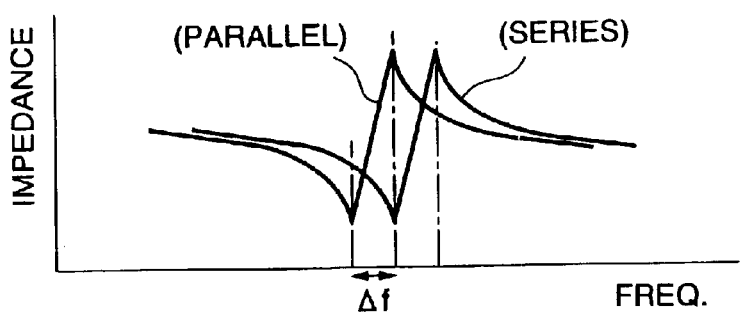
FIG. 21 is a diagram of curve showing the impedance characteristics of the thin film bulk acoustic wave resonator used for the band pass filter relating to the embodiment 10 of the invention.

As shown in FIG. 21, the thin film bulk acoustic wave resonators 267 connected in parallel and the thin film bulk acoustic wave resonators 266 connected in series have the central frequencies thereof respectively, which are different from each other by slightly Δf. In this case, the resonant frequency of the thin film bulk acoustic wave resonators 266 connected in series is to coincide with the anti-resonant frequency of the thin film bulk acoustic wave resonators 267 connected in parallel.

Figure 22:
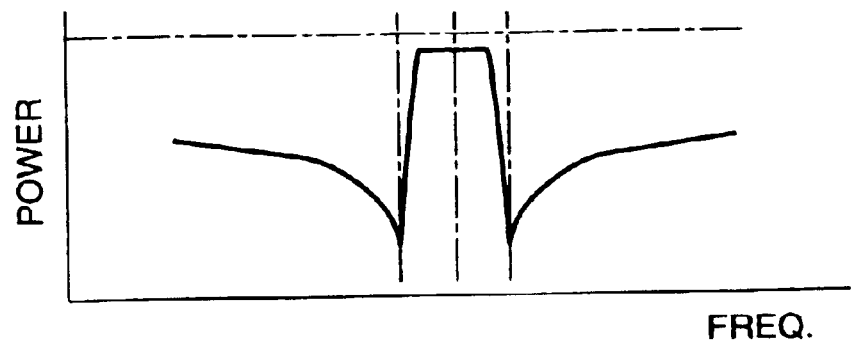
FIG. 22 is a diagram of curve showing the passing power characteristics of the band pass filter relating to the embodiment 10 of the invention.

FIG. 22 shows the passing characteristics of the symmetric band pass filter 265. The band pass filter 265 filters some frequencies having a certain width as shown in the figure.

In this embodiment, a thin film bulk acoustic wave resonator 262 used for the oscillation circuit, thin film bulk acoustic wave resonators 266 connected in series used for the band pass filter, and the thin film bulk acoustic wave resonators 267 connected in parallel were formed all together on the same insulative silicon substrate by substantially the same process. Namely, the thickness 110 nm of the ferroelectric film and the thickness 15 nm of the lower electrode were common to all the above resonators, and the thickness of the upper electrode of each resonator was set to be 20 nm, 23 nm, or 17 nm so as to tune the central resonant frequency.

Figure 23:
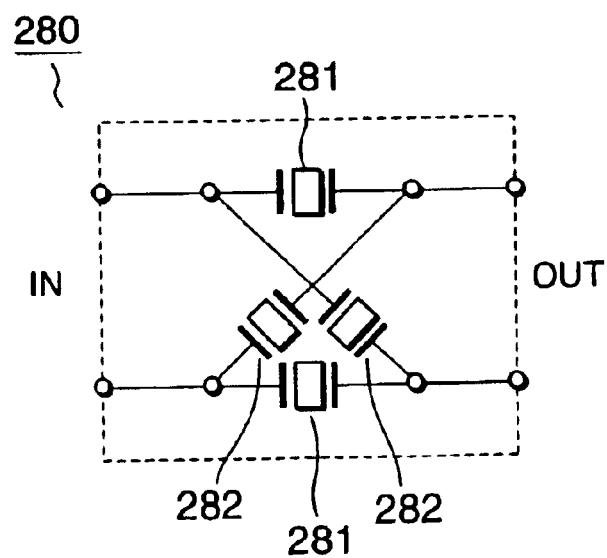
FIG. 23 is a circuit diagram of the symmetrical lattice type band pass filter relating to the embodiment 10 of the invention.

FIG. 23 shows a circuit of the symmetric lattice type band pass filter as a variation.

This symmetric lattice type band pass filter is a lattice type filter 280 comprising two thin film bulk acoustic wave resonators 281 connected together in series and two thin film bulk acoustic wave resonators 282 connected together in parallel.

Thanks to this structure, the resonators used for the oscillation circuit and the thin film bulk acoustic wave resonators constituting the band pass filter for removing a ripple component of the oscillation circuit could be formed on the same substrate by substantially a single process, so that the voltage controlled oscillator with high performance could be formed by an easy process.

In this embodiment, the resonator for the voltage controlled oscillator and the resonator for the filter were formed simultaneously on the same substrate, with paying attention to the fact that the band pass filter and the low pass filter could be formed by combining a plurality of the thin film bulk acoustic wave resonators. Because ripple components of harmonic wave are usually included in the output of the voltage controlled oscillator, the ripple components can be removed by e.g. a low pass filter if the voltage controlled oscillator is used for an RF receiving circuit or a transmitting circuit.

This embodiment can form the voltage controlled oscillator and the filter by the same process, so that the advantage thereof is great. As the filter comprised of the thin film bulk acoustic wave resonators, the ladder type filter and the lattice type filter mentioned above are quoted.

(Embodiment 11)

Figure 24:
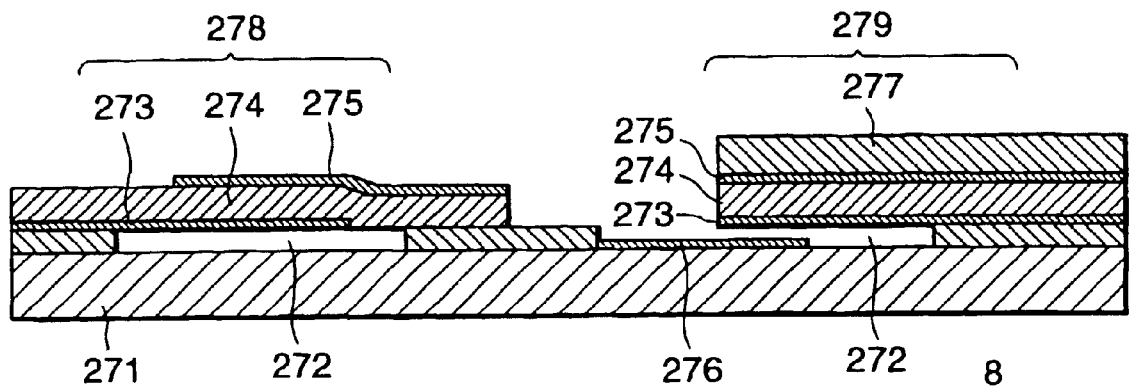
FIG. 24 is a pattern cross section of the thin film bulk acoustic wave resonator and the piezoelectric switching element in the voltage controlled oscillator relating to the embodiment 11 of the invention.

FIG. 24 shows a cross section of the voltage controlled oscillator having a thin film bulk acoustic wave resonator 278 and a piezoelectric switching element 279 relating to the embodiment 11 of the invention, both of which are formed on the same substrate 271 by means of substantially the same material and process.

The thin film bulk acoustic wave resonator 278 was prepared by forming a lower electrode 273, a piezoelectric film 274, and an upper electrode 275 sequentially on a silicon substrate 271 via a cavity 272. The piezoelectric switching element 279 has a structure prepared by forming the lower electrode 273, the piezoelectric film 274, and the upper electrode 275 sequentially on the silicon substrate 271 via the cavity 272 of open structure, which are common to the above resonator, and further added thereto by a counter electrode 276 and a cantilever 277. That is to say, this is a piezoelectric actuator in which the cantilever bends so as to contact the lower electrode 273 with the counter electrode 276 when a voltage is applied between the two electrodes.

In this embodiment, single crystal Pt deposited on the substrate by epitaxial growth was used for the lower electrode 273 and the upper electrode 275, and also single crystal barium titanate ferroelectric material deposited on the substrate by epitaxial growth was used for the ferroelectric film 274. The electrodes and the piezoelectric member were formed simultaneously by the same process.

Thus, the voltage controlled oscillator employing the thin film bulk acoustic wave resonator and the switching element shown in FIG. 17 and FIG. 19 already shown can be easily constructed by forming the thin film bulk acoustic wave resonator and the piezoelectric switching element of low on-resistance simultaneously on the same substrate.

Combining the thin film bulk acoustic wave resonator with the switching element can construct the voltage controlled oscillator having a wide variable range of frequency. The switching element employing the piezoelectric actuator has an advantage that it can form an oscillation circuit containing a switching element with a high Q value because it has a low on-resistance compared to the switching element employing semiconductors.

(Embodiment 12)

Figure 25:
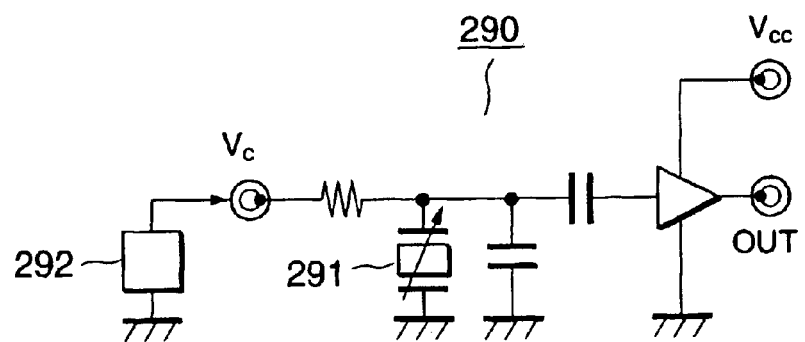
FIG. 25 is an equivalent circuit diagram of the voltage controlled oscillator relating to the embodiment 12 of the invention.

FIG. 25 shows a circuit diagram of the voltage controlled oscillator 290 relating to the embodiment 12 of the invention.

The thin film bulk acoustic wave resonator 291 may be the one explained in FIG. 1.

This oscillation circuit 290 has the thin film bulk acoustic wave resonator 291 connected in parallel between the control voltage Vc and the output Out. One side of the thin film bulk acoustic wave resonator 291 is grounded.

Because the acoustic velocity in the ferroelectric material varies when a DC bias voltage corresponding to the control voltage Vc is applied between both electrodes of the thin film bulk acoustic wave resonator 291 through a control voltage circuit 292, the resonant frequency and anti-resonant frequency thereof can be made variable.

Figure 26:
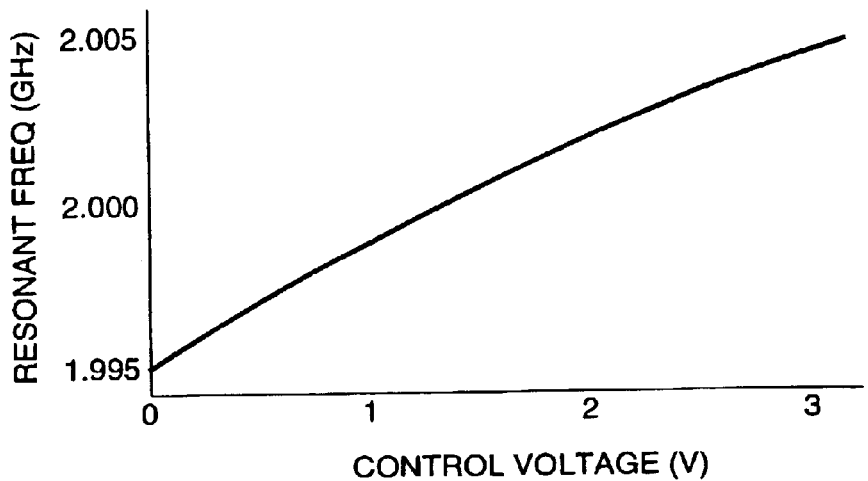
FIG. 26 is a graph showing the relation between the control voltage and the oscillation frequency of the voltage controlled oscillator relating to the embodiment 12 of the invention.
Figure 27:
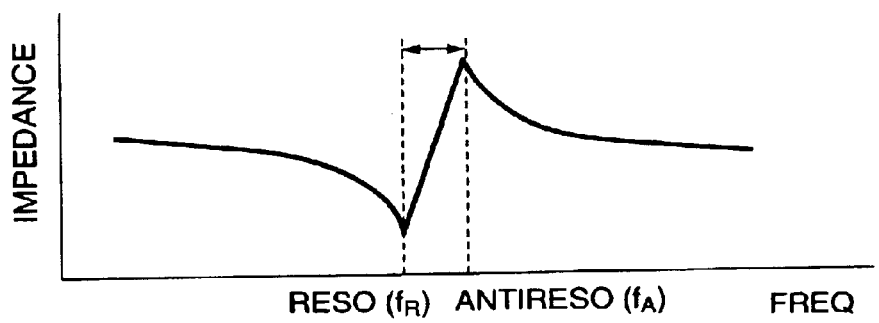
FIG. 27 is a diagram of curve showing the impedance characteristics of a conventional thin film bulk acoustic wave resonator.
Figure 28:
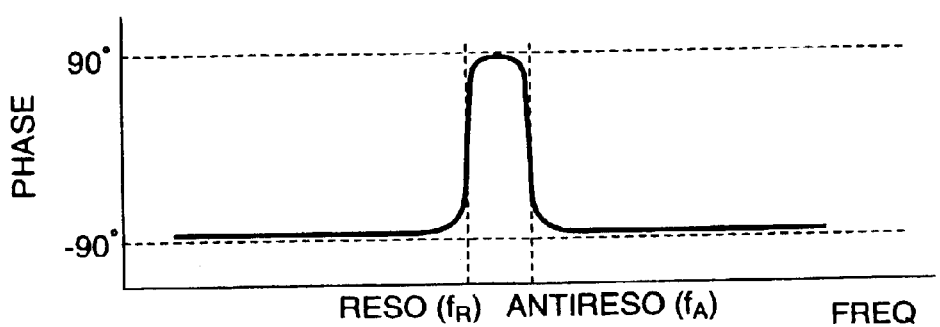
FIG. 28 is a diagram of curve showing the phase characteristics of a conventional thin film bulk acoustic wave resonator.

FIG. 26 shows the result of measurement about the resonant frequency and the anti-resonant frequency versus the control voltage in this thin film bulk acoustic wave resonator. In this case, the thickness of the ferroelectric film was 1100 nm; the thickness of the lower electrode was 100 nm; and the thickness of the upper electrode was 150 nm. Additionally, the fixed load capacitance of the oscillation circuit 110 was 9 pF.

As seen in FIG. 26, when the control voltage Vc is changed from 0.2 V to 3.0 V, the resonant frequency varies from 1.995 GHz to 2.0055 GHz. Variation rate of approximately 0.20%/V was observed. Moreover, very high Q value of 900 is obtained, and an oscillation with low phase noise can be achieved.

The voltage controlled oscillator of excellent quality suitable for the application of variable frequency range equal to or narrower than 10 MHz at 2 GHz band can be provided.

In the embodiments explained above, the single crystal ferroelectric material used for the ferroelectric film of the thin film bulk acoustic wave resonator is preferably a ferroelectric material of perovskite system formed on a single crystal substrate by epitaxial growth, and the ferroelectric material of perovskite system is preferably a ferroelectric material whose principal component is barium titanate or lead titanate zirconate.

The reason for the above is that the ferroelectric material whose principal component is barium titanate or lead titanate zirconate has a very high electromechanical coupling coefficient when it is prepared in the form of single crystal, and further has field dependence of high acoustic velocity.

Though each embodiment mentioned above can be utilized independently, combining some of them exerts further great effect.

As mentioned above, the present invention can provide a voltage controlled oscillator capable of oscillating a plurality of frequencies simultaneously, having a wide variable range of frequency, high stability of frequency, an excellent low phase noise, small variation per hour, and a miniaturized package.

What is claimed is:

1. A voltage controlled oscillator comprising:
   at least one thin film bulk acoustic wave resonator comprising;
      a ferroelectric thin film equal to or smaller than 10 $\mu$m in thickness of perovskite type single crystal whose direction of polarization is aligned to the direction of thickness thereof; and
      a pair of thin film electrodes provided so as to interpose the ferroelectric thin film between them, and changing a resonant frequency by a voltage applied between the pair of thin film electrodes:
   a control voltage circuit applying the voltage between the pair of thin film electrodes: and
   an amplifier coupled with the thin film bulk acoustic wave resonator constituting an oscillation circuit in cooperation with the resonator.

2. The voltage controlled oscillator as set forth in claim 1, wherein the voltage controlled oscillator comprises a plurality of the thin film bulk acoustic wave resonators elastically coupled to each other.

3. The voltage controlled oscillator as set forth in claim 1, wherein the oscillator comprises a balanced circuit combining the plurality of thin film bulk acoustic wave resonator.

4. The voltage controlled oscillator as set forth in claim 1, comprising;
   a first oscillation loop comprising a first thin film bulk acoustic wave resonator and a first amplifier;
   a second oscillation loop comprising a second thin film bulk acoustic wave resonator and a second amplifier, and insulated electrically from the first oscillation loop; and
   means for coupling elastically the first thin film bulk acoustic wave resonator to the second thin film bulk acoustic wave resonator.

5. The voltage controlled oscillator as set forth in claim 2, wherein the elastic coupling is a reverse phase coupling.

6. The voltage controlled oscillator as set forth in claim 1, wherein a plurality of the thin film bulk acoustic wave resonators are connected in series to each other so as to construct a series circuit, and the amplifier is connected in parallel to the series circuit to oscillate at a frequency in the vicinity of an anti-resonant point of the plurality of thin film bulk acoustic wave resonators.

7. The voltage controlled oscillator as set forth in claim 4, wherein the oscillator oscillates at a frequency in the vicinity of a resonance point of the first and the second thin film bulk acoustic wave resonators.

8. The voltage controlled oscillator as set forth in claim 1, wherein the oscillator comprises a series circuit or a parallel circuit comprising the thin film bulk acoustic wave resonator and a capacitor of a predetermined capacitance connected on at least one electrode of the thin film bulk acoustic wave resonator, and the resonant frequency of the circuit being changed by a voltage applied between the pair of the electrodes of the thin film bulk acoustic wave resonator.

9. The voltage controlled oscillator as set forth in claim 1, wherein the voltage control circuit is a DC voltage source.

10. The voltage controlled oscillator as set forth in claim 1, wherein the ferroelectric thin film is an epitaxial growth film of barium titanate or lead zirconate titanate.

11. A voltage controlled oscillator comprising:
   a first thin film bulk acoustic wave resonator comprising;
      a first ferroelectric thin film equal to or smaller than 10 $\mu$m in thickness of perovskite type single crystal whose direction of polarization is aligned to the direction of thickness thereof; and
      a first and a second thin film electrodes provided interposing the first ferroelectric thin film between them:
   a second thin film bulk acoustic wave resonator comprising;

a second ferroelectric thin film equal to or smaller than 10 μm in thickness of perovskite type single crystal whose direction of polarization is aligned to the direction of thickness thereof; and a third thin film electrode interposing the second ferroelectric thin film in cooperation with the second electrode, and deposited on the first thin film bulk acoustic wave resonator in the direction of thickness thereof and sharing the second electrode as a common electrode:

a control voltage circuit applying a voltage between the electrodes: and an amplifier coupled with the first and the second thin film bulk acoustic wave resonators to constitute an oscillation circuit.

12. The voltage controlled oscillator as set forth in claim 11, wherein the first thin film bulk acoustic wave resonator and the second thin film bulk acoustic wave resonator are elastically coupled to each other.

13. The voltage controlled oscillator as set forth in claim 11, wherein thickness including the first and the second ferroelectric thin films and the first to the third electrodes is one fourth of the wavelength of a fundamental oscillation frequency.

14. A voltage controlled oscillator comprising:

a substrate:

a first thin film bulk acoustic wave resonator provided on the substrate comprising;

a ferroelectric thin film equal to or smaller than 10 μm in thickness of perovskite type single crystal whose direction of polarization is aligned to the direction of thickness thereof; and a first and a second thin film electrodes interposing the ferroelectric thin film between them:

a second thin film bulk acoustic wave resonator comprising a third and a fourth thin film electrodes to interpose the ferroelectric thin film between them, provided adjacent to the first thin film bulk acoustic wave resonator on the substrate, and sharing the ferroelectric film with the first thin film bulk acoustic wave resonator:

a control voltage circuit applying a voltage between the thin film electrodes: and an amplifier coupled with the first and the second thin film bulk acoustic wave resonators, constituting an oscillation circuit.

15. The voltage controlled oscillator as set forth in claim 14, wherein the first thin film bulk acoustic wave resonator and the second thin film bulk acoustic wave resonator are elastically connected to each other.

16. A voltage controlled oscillator comprising:

a plurality of voltage controlled oscillators comprising;

at least one thin film bulk acoustic wave resonator comprising;

a ferroelectric thin film equal to or smaller than 10 μm in thickness of perovskite type single crystal whose direction of polarization is aligned to the direction of thickness thereof; and a pair of thin film electrodes interposing the ferroelectric thin film between them, and changing a resonant frequency by a voltage applied between the pair of thin film electrodes;

a control voltage circuit applying the voltage between the pair of thin film electrodes; and an amplifier connected to the thin film bulk acoustic wave resonator to constitute an oscillation circuit in cooperation with the resonator:

means for oscillating the plurality of the voltage controlled oscillators with different frequencies: and a multiplier connected to the plurality of the voltage controlled oscillators to output a difference of output frequencies of the voltage controlled oscillators.

17. The voltage controlled oscillator as set forth in claim 1, wherein the voltage controlled oscillator comprises a plurality of capacitors connected selectively to the thin film bulk acoustic wave resonator to construct a series circuit or a parallel circuit therewith, and the resonant frequency thereof is controlled by means of combination with at least one of the capacitors.

18. The voltage controlled oscillator as set forth in claim 1, wherein the voltage controlled oscillator comprises a plurality of thin film bulk acoustic wave resonators connected selectively to a predetermined capacitor to construct a series circuit or a parallel circuit therewith, wherein the resonant frequency is controlled by means of combination with at least one of the thin film bulk acoustic wave resonators.

19. A voltage controlled oscillator comprising:

a substrate:

a thin film bulk acoustic wave resonator provided on the substrate, comprising;

a ferroelectric thin film equal to or smaller than 10 μm in thickness of perovskite type single crystal whose direction of polarization is aligned to the direction of thickness thereof; and a first and a second thin film electrodes provided so as to interpose the ferroelectric thin film between them:

a switching element comprising thin film electrodes provided adjacent to the thin film bulk acoustic wave resonator on the substrate, and sharing the ferroelectric film with the thin film bulk acoustic wave resonator, so as to interpose the ferroelectric thin film between them, and applying the ferroelectric thin film as an actuator:

a control voltage circuit applying a voltage between the first and the second electrodes: and an amplifier connected to the first and the second thin film bulk acoustic wave resonators so as to constitute an oscillation circuit.

* * * * *